United States Patent
Hembree

(10) Patent No.: US 7,371,676 B2
(45) Date of Patent: May 13, 2008

(54) METHOD FOR FABRICATING SEMICONDUCTOR COMPONENTS WITH THROUGH WIRE INTERCONNECTS

(75) Inventor: David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 307 days.

(21) Appl. No.: 11/102,408

(22) Filed: Apr. 8, 2005

(65) Prior Publication Data

US 2006/0228825 A1    Oct. 12, 2006

(51) Int. Cl.
    *H01L 23/49* (2006.01)
(52) U.S. Cl. ............... 438/617; 257/784; 257/E23.023; 228/180.5
(58) Field of Classification Search .............. 438/617; 257/784, E23.023; 228/180.5
    See application file for complete search history.

(56) References Cited

U.S. PATENT DOCUMENTS

| | | | |
|---|---|---|---|
| 3,761,782 A | | 9/1973 | Youmans |
| 4,394,712 A | | 7/1983 | Anthony |
| 4,710,795 A | | 12/1987 | Nippert et al. |
| 4,897,708 A | | 1/1990 | Clements |
| 5,229,647 A | | 7/1993 | Gnadinger |
| 5,432,999 A | | 7/1995 | Capps |
| 5,483,741 A | | 1/1996 | Akram et al. |
| 5,495,667 A | * | 3/1996 | Farnworth et al. ............ 29/843 |
| 5,496,775 A | | 3/1996 | Brooks |
| 5,852,871 A | * | 12/1998 | Khandros .................... 29/843 |
| 5,894,983 A | | 4/1999 | Beck et al. |
| 5,931,685 A | | 8/1999 | Hembree et al. |
| 5,990,546 A | | 11/1999 | Igarashi et al. |
| 6,002,177 A | * | 12/1999 | Gaynes et al. .............. 257/774 |
| 6,107,109 A | | 8/2000 | Akram et al. |
| 6,184,587 B1 | * | 2/2001 | Khandros et al. ........... 257/784 |

(Continued)

OTHER PUBLICATIONS

Ivy Wei Qin et al., "Automatic Wedge Bonding with Ribbon Wire For High Frequency Applications", SEMICON West 2002 SEMI Technology Symposium, pp. 1-11.

(Continued)

*Primary Examiner*—B. William Baumeister
*Assistant Examiner*—Steven J. Fulk
(74) *Attorney, Agent, or Firm*—Stephen A. Gratton

(57) ABSTRACT

A method for fabricating a semiconductor component with a through wire interconnect includes the step of providing a substrate having a circuit side, a back side, and a through via. The method also includes the steps of: threading a wire through the via, forming a contact on the wire on the back side, forming a bonded contact on the wire on the circuit side, and then severing the wire from the bonded contact. The through wire interconnect includes the wire in the via, the contact on the back side and the bonded contact on the circuit side. The contact on the back side, and the bonded contact on the circuit side, permit multiple components to be stacked with electrical connections between adjacent components. A system for performing the method includes the substrate with the via, and a wire bonder having a bonding capillary configured to thread the wire through the via, and form the contact and the bonded contact. The semiconductor component can be used to form chip scale components, wafer scale components, stacked components, or interconnect components for electrically engaging or testing other semiconductor components.

32 Claims, 17 Drawing Sheets

U.S. PATENT DOCUMENTS

| | | | |
|---|---|---|---|
| 6,251,703 B1 | 6/2001 | Van Campenhout et al. | |
| 6,294,837 B1 | 9/2001 | Akram et al. | |
| 6,326,689 B1 | 12/2001 | Thomas | |
| 6,380,555 B1 | 4/2002 | Hembree et al. | |
| 6,395,581 B1 | 5/2002 | Choi | |
| 6,400,172 B1 | 6/2002 | Akram et al. | |
| 6,444,576 B1 | 9/2002 | Kong | |
| 6,451,624 B1 | 9/2002 | Farnworth et al. | |
| 6,501,165 B1 | 12/2002 | Farnworth et al. | |
| 6,528,984 B2 * | 3/2003 | Beaman et al. | 324/158.1 |
| 6,566,747 B2 | 5/2003 | Ohuchi et al. | |
| 6,569,762 B2 | 5/2003 | Kong | |
| 6,577,013 B1 * | 6/2003 | Glenn et al. | 257/777 |
| 6,600,221 B2 | 7/2003 | Kimura | |
| 6,605,551 B2 | 8/2003 | Wermer et al. | |
| 6,620,633 B2 | 9/2003 | Hembree et al. | |
| 6,620,731 B1 | 9/2003 | Farnworth et al. | |
| 6,653,170 B1 * | 11/2003 | Lin | 438/117 |
| 6,717,245 B1 | 4/2004 | Kinsman et al. | |
| 6,803,303 B1 | 10/2004 | Hiatt et al. | |
| 6,812,549 B2 * | 11/2004 | Umetsu et al. | 257/621 |
| 6,828,175 B2 | 12/2004 | Wood et al. | |
| 6,833,613 B1 | 12/2004 | Akram et al. | |
| 6,841,883 B1 | 1/2005 | Farnworth et al. | |
| 6,848,177 B2 | 2/2005 | Swann et al. | |
| 6,881,648 B2 | 4/2005 | Chen et al. | |
| 6,882,057 B2 | 4/2005 | Hsu | |
| 6,896,170 B2 * | 5/2005 | Lyn et al. | 228/4.5 |
| 6,903,443 B2 | 6/2005 | Farnworth et al. | |
| 6,906,418 B2 | 6/2005 | Hiatt et al. | |
| 6,908,784 B1 | 6/2005 | Farnworth et al. | |
| 6,936,913 B2 | 8/2005 | Akerling et al. | |
| 6,952,054 B2 | 10/2005 | Akram et al. | |
| 6,964,915 B2 | 11/2005 | Farnworth et al. | |
| 6,998,717 B2 | 2/2006 | Farnworth et al. | |
| 7,108,546 B2 | 9/2006 | Miller et al. | |
| 2002/0017710 A1 | 2/2002 | Kurashima et al. | |
| 2002/0117330 A1 * | 8/2002 | Eldridge et al. | 174/260 |
| 2003/0230805 A1 | 12/2003 | Noma et al. | |
| 2003/0232460 A1 * | 12/2003 | Poo et al. | 438/106 |
| 2004/0235270 A1 | 11/2004 | Noma et al. | |
| 2007/0126091 A1 | 6/2007 | Wood et al. | |
| 2007/0138498 A1 | 6/2007 | Zilber et al. | |

OTHER PUBLICATIONS

International Technology Roadmap for Semiconductors, 2005 Edition, Assembly and Packaging, pp. 1-44.

Renesas, Hitachi and Renesas Technology Develop Through-Hole Electrode Technology to Enable Interconnection of Stacked Chips at Room Temperature, News Release, Jun. 1, 2005, p. 1-2.

Dr. Ning-Cheng Lee, "The Use of Solder as an Area-Array Package Interconnect", Chip Scale Review, Sep.-Oct. 1999, pp. 1-8, Available on line: www.chipscalereview.com/issues/.

Indium Corporation of America. Product Data Sheet. "Pb-Free Solder Fabrication", pp. 1-2, date unavailable.

Lulicke & Soffa. "Dispense/UV Cure Kit for NOSWEEP™", advertising, 2004, pp. 1-2. Available on line: www.kns.com.

* cited by examiner

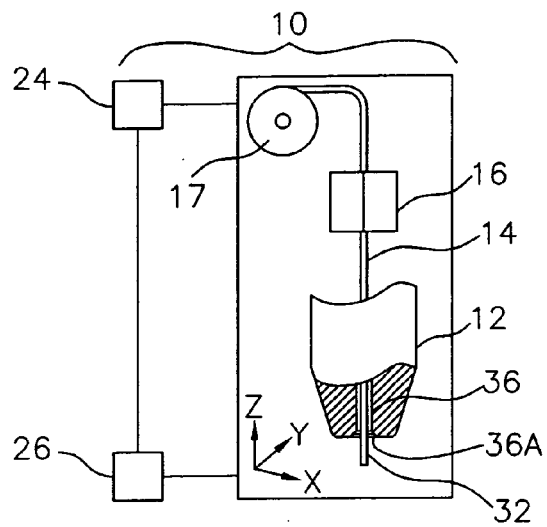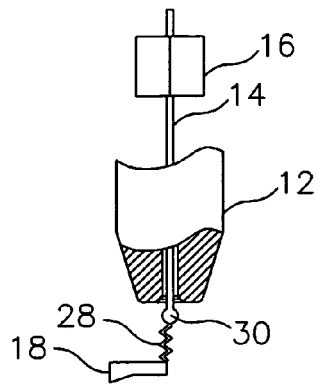
FIGURE 1A　　　　　FIGURE 1B
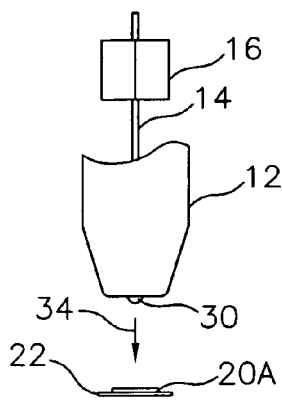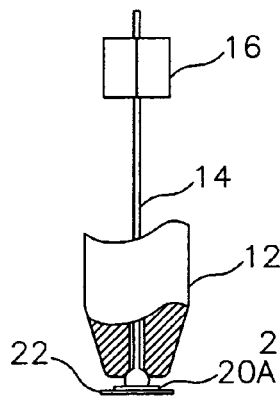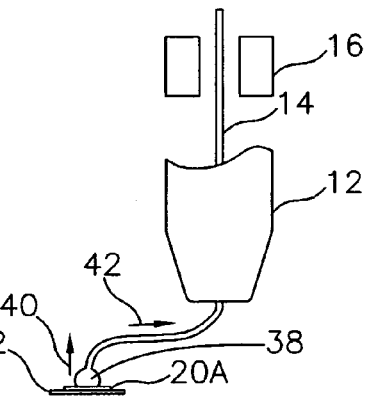
FIGURE 1C　　　FIGURE 1D　　　FIGURE 1E
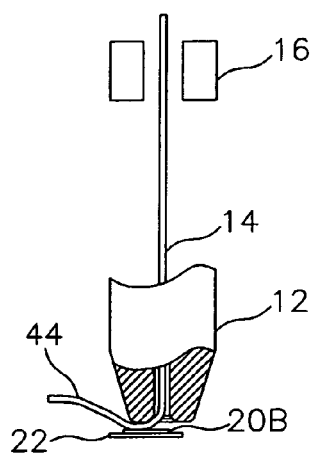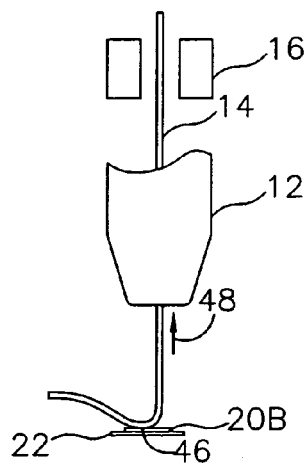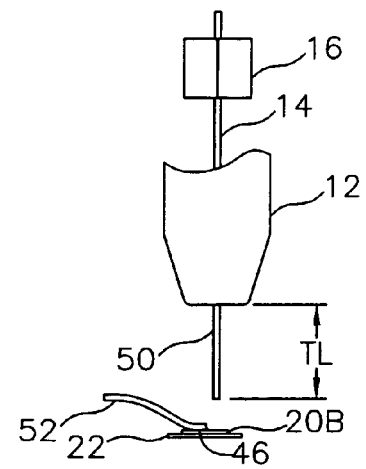
FIGURE 1F　　　FIGURE 1G　　　FIGURE 1H

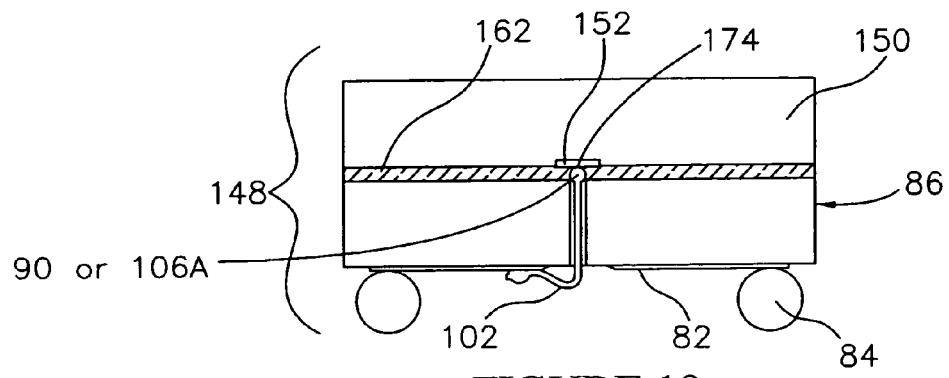
FIGURE 10
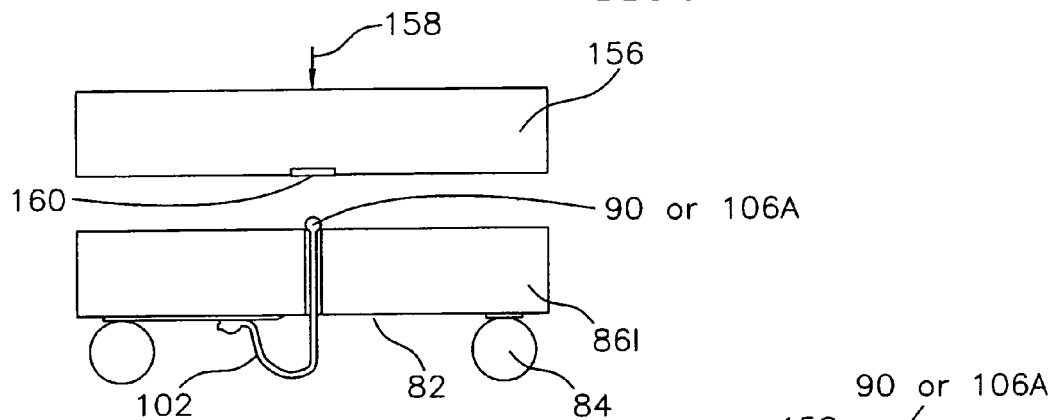
FIGURE 11A
FIGURE 11B
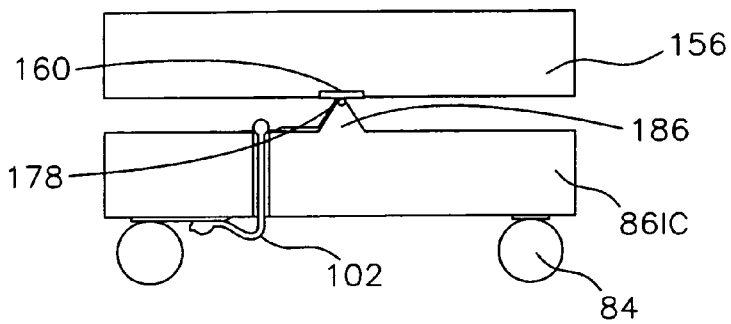
FIGURE 12

METHOD FOR FABRICATING SEMICONDUCTOR COMPONENTS WITH THROUGH WIRE INTERCONNECTS

CROSS REFERENCE TO RELATED APPLICATIONS

This application is related to Ser. No. 11/743,636 filed May 2, 2007, to Ser. No. 11/743,660 filed May 2, 2007 and to Ser. No. 11/743,689 filed May 3, 2007.

FIELD OF THE INVENTION

This invention relates generally to semiconductor packaging, and particularly to a method and system for fabricating semiconductor components with through wire interconnects. This invention also relates to semiconductor components having through wire interconnects fabricated using the method and system.

BACKGROUND OF THE INVENTION

A semiconductor component includes a semiconductor substrate containing various semiconductor devices and integrated circuits. Typically, the semiconductor substrate comprises a semiconductor die, that has been singulated from a semiconductor wafer. For example, a chip scale semiconductor component includes a semiconductor die provided with support and protective elements, and an external signal transmission system. Semiconductor components can also include multiple semiconductor substrates in a stacked or planar array. For example, a system in a package (SIP) includes multiple semiconductor dice packaged in a plastic body. A semiconductor component can also include a support substrate, such as a module substrate, a test substrate, or a printed circuit board, configured to electrically engage a semiconductor substrate.

As semiconductor components become smaller and have higher input/output configurations, different types of interconnects have been developed for implementing different signal transmission systems. Interconnects can be formed "on" the semiconductor substrate for transmitting signals in x and y directions. Interconnects can also be formed "in" the semiconductor substrate for transmitting signals in a z direction, or "external" to the semiconductor substrate for transmitting signals in x, y and z directions.

For example, surface interconnects, such as conductors "on" a circuit side of the semiconductor component, can be used to electrically connect the integrated circuits with terminal contacts on the circuit side. Via interconnects, such as metal filled vias formed "in" the semiconductor substrate, can be used to electrically connect the integrated circuits to terminal contacts on a back side of the semiconductor substrate. Wire interconnects, such as wires bonded to the semiconductor substrate, can be used to electrically connect the integrated circuits to "external" terminal contacts on a support substrate for the component.

In fabricating semiconductor components, particularly chip scale components, interconnects having a high electrical conductivity and a low parasitic capacitance provide the best performance in the signal transmission system. In addition, it is advantageous for interconnects to be capable of fabrication in dense arrays using conventional equipment and techniques. Further, it is advantageous for interconnects to require as little space and additional elements as possible. In this regard, each of the different types of interconnects has advantages and disadvantages.

One significant advantage of via interconnects is that they occupy space in the semiconductor substrate that is otherwise unused. This facilitates the fabrication of small, highly integrated semiconductor components. The disadvantages of via interconnects include a relatively low electrical conductivity, a relatively high capacitance, and a relatively low reliability, particularly with temperature cycling. In addition, via interconnects can require expensive fabrication techniques, such as the filling of vias using seed and plating metallization equipment.

On the other hand, wire interconnects require additional space and insulation, but have a higher electrical conductivity, and a lower capacitance, than via interconnects. In addition, wire interconnects can be made using mature, economical and robust wire bonding processes and equipment.

The present invention is directed to a method and system for fabricating semiconductor components with through wire interconnects. The through wire interconnects are hybrids, which combine aspects of both via interconnects and wire interconnects. In addition, the present invention is directed to semiconductor components, including chip scale components, wafer scale components, stacked components, and interconnect components having through wire interconnects fabricated using the method and the system.

SUMMARY OF THE INVENTION

In accordance with the present invention, a method and a system are provided for fabricating semiconductor components with through wire interconnects. Also provided are improved semiconductor components having through wire interconnects.

The method is performed on a substrate having a circuit side (first side in the claims), a back side (second side in the claims), and a through via. The steps of the method can be performed using a conventional wire bonder having a bonding capillary and an alignment system configured to align the bonding capillary to the via. The method includes the steps of threading a wire through the via, forming a back side contact on the wire proximate to the back side, forming a bonded contact on the wire on the circuit side, severing the wire from the bonded contact, and optionally forming a stud bump on the bonded contact.

The method forms a through wire interconnect which includes the wire in the via having the contact on the back side, and the bonded contact on the circuit side. The through wire interconnect can be used to provide electrical and thermal paths through the substrate. The through wire interconnect can also be used for stacking multiple semiconductor components, as it provides a bonding structure and a conductive path between stacked components. In addition, the wire has a higher conductivity and a lower capacitance than conventional metal filled vias. Further, the wire can be configured to move in the via for accommodating variations in thermal expansion between the wire and the substrate. Alternately, the via can be filled with a material, which secures the wire in the via, and performs a desired function in the component. For example, the material can comprise a dielectric material configured to change the capacitive coupling of the wire to the substrate, or to adjacent wires. The material can also be used to structurally strengthen and support the wire, and to electrically insulate the wire from the substrate. Further, the material can comprise a thermally conductive material, configured to conduct heat through the substrate, such as away from active electrical elements.

An alternate embodiment stacked method is performed on a stack of spaced substrates having spacers and aligned vias. The stacked method includes the steps of threading a wire through the aligned vias, forming a contact on the wire, pulling the contact against a first outer substrate of the stack, forming a bonded contact on a second outer substrate of the stack, and forming bonded connections between the substrates and the wire in the aligned vias. The stacked method forms a stacked through wire interconnect that interconnects all of the substrates in the stack. The stacked method can also include the step of threading and bonding a side wire to the stacked through wire interconnect using a space between adjacent substrates.

The system includes the substrate having the circuit side, the back side, and the via. The system also includes a wire bonder having a bonding capillary for threading, bonding and severing the wire, clamps or a wire threading mechanism for manipulating the wire, and a wand for forming the contact on the wire.

An alternate embodiment system includes a wire bonder in combination with a stud bumper configured to form the stud bump on the bonded contact on the circuit side, or alternately a stud bump on the contact on the back side. Another alternate embodiment system includes a wire bonder having a first bonding capillary configured to perform steps from the circuit side of the substrate, and a second bonding capillary configured to perform steps from a back side of the substrate. Another alternate embodiment system includes a wire bonder having a side feed bonding capillary and a laser configured to bond a side wire between stacked substrates. In addition, the side feed bonding capillary can be rotatable about a 90° angle for bonding on orthogonally oriented surfaces.

The semiconductor component includes the substrate and the though wire interconnect. The through wire interconnect includes the wire in the via having the bonded contact on the circuit side, and the contact on the back side. Multiple semiconductor components can stacked to form a stacked component having bonded connections between the bonded contacts on the circuit side, and the contacts on the back side, on adjacent components.

An alternate embodiment interconnect component includes a through wire interconnect having the contact on the back side, or a separate contactor, configured to make non bonded electrical connections with test pads on a device under test. An alternate embodiment stacked array semiconductor component includes stacked semiconductor substrates interconnected by a single through wire interconnect.

An alternate embodiment side wire semiconductor component includes stacked substrates, a side wire interconnect, and a side mounted component. In addition, the stacked substrates can include a heat sink, and the side mounted component can include a cooling assembly. An alternate embodiment compressed bump semiconductor component includes a through wire interconnect having a bonded contact in the form of compressed wire bump. An alternate embodiment organic semiconductor component includes an organic substrate, and a through wire interconnect bonded to contacts on the substrate. Alternately, the organic substrate can comprise a ceramic substrate or a metal substrate. An alternate embodiment flex circuit semiconductor component includes a substrate having a flex circuit attached thereto, and a through wire interconnect bonded to the flex circuit.

BRIEF DESCRIPTION OF THE DRAWINGS

FIGS. 1A-1H are schematic cross sectional views of elements of the system illustrating set up steps in the method of the invention;

FIG. 10 is a schematic cross sectional view of a stacked die component constructed in accordance with the invention;

FIGS. 11A and 11B are schematic cross sectional views of an interconnect component constructed in accordance with the invention;

FIG. 12 is a schematic cross sectional view of an interconnect component with a contactor constructed in accordance with the invention;

DETAILED DESCRIPTION OF THE PREFERRED EMBODIMENTS

Figure 2A:
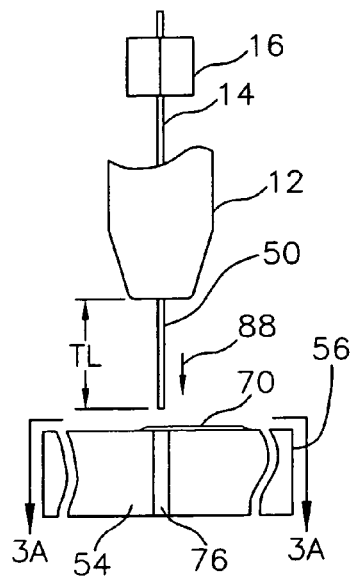
FIGS. 2A-2L are schematic cross sectional views of elements of the system illustrating steps in the method of the invention.

As used herein, "semiconductor component" means an electronic element that includes a semiconductor die, or makes electrical connections with a semiconductor die.

As used herein "wafer-level" means a process conducted on an element, such as a semiconductor wafer, containing multiple components.

As used herein "die level" means a process conducted on a singulated element such as a singulated semiconductor die or package.

As used herein "chip scale" means a semiconductor component having an outline about the same size as the outline of a semiconductor die.

Referring to FIGS. 1A-1H, set up steps in the method of the invention are illustrated. For performing the method of the invention a wire bonder 10 (FIG. 1A) can be provided. Preferably the wire bonder 10 (FIG. 1A) is configured to perform an ultra fine pitch (e.g., <65 µm) wire bonding process. Suitable wire bonders are manufactured by Kulicke & Soffa Industries Inc. of Willow Grove, Pa., and SPT (Small Precision Tools) of Petaluma, Calif. One suitable wire bonder is a model "8098" large area ball bonder manufactured by Kulicke & Soffa Industries Inc., having a total bond placement accuracy of about +/−5 µm at pitches down to about 65 µm.

The wire bonder 10 includes a bonding capillary 12 configured to bond a continuous length of wire 14 to a first contact 20A (FIG. 1C) on a substrate 22 (FIG. 1C). For performing the set up steps, the first contact 20A (FIG. 1C) and the substrate 22 (FIG. 1C) can comprise dummies or set up elements. A representative diameter of the bonding wire 14 can be from about 12 µm to about 150 µm. In addition, the bonding wire 14 can comprise a conventional wire material used in semiconductor packaging, such as solder alloys, gold, gold alloys, copper, copper alloys, silver, silver alloys, aluminum, aluminum-silicon alloys, and aluminum-magnesium alloys. In addition, the wire 14 can comprise a metal, or a metal alloy, that does not contain reductions of hazardous substances (ROHS), such as lead. Exemplary ROHS free metals include lead free solders, such as 97.5% Sn2.5% Ag. Other ROHS free metals include gold, copper and alloys of these metals such as copper coated with a layer of flash gold. Also, the melting point of the wire 14 should preferably be greater than that of the substrate contact 20A.

As shown FIG. 1A, the bonding capillary 12 is movable in x, y and z directions responsive to signals from a controller 24 (FIG. 1A). As will be further explained, the bonding capillary 12 can also be configured for 90° rotation to allow side wire bonding. The bonding capillary 12 includes an elongated opening 36 having an inside diameter about twice the diameter of the wire 14, and an enlarged, chamfered terminal portion 36A. The wire bonder 10 also includes wire clamps 16 operably associated with the bonding capillary 12, which are configured to open and close about the wire 14 responsive to signals from the controller 24.

As also shown in FIG. 1A, the wire clamps 16 are operably associated with a wire feed mechanism 17 configured to feed the wire 14 into the wire clamps 16 and the bonding capillary 12. The wire feed mechanism 17 can comprise a standard wire feed mechanism, such as one incorporated into the above described model "8098" large area ball bonder from Kulicke & Soffa. Alternately, as will be further explained, the wire feed mechanism 17 can comprise a mechanical wire feeder mechanism, such as a roller feed mechanism, or a linear motion clamp and feed mechanism.

As also shown in FIG. 1A, the wire bonder 10 also includes an alignment system 26 configured to ascertain the locations of the bonding capillary 12 and the first contact 20A (FIG. 1C), and to supply information on these locations to the controller 24 for aligning the bonding capillary 12 to the first contact 20A (FIG. 1C). As an alternative to the above arrangement, the bonding capillary 12 can comprise a stationary element, while the substrate 22 and the first contact 20A are moved into alignment using a suitable mechanism (not shown).

The wire bonder 10 also includes an electronic flame off (EFO) wand 18 (FIG. 1B) configured to generate an electronic spark 28 (FIG. 1B) for forming a contact ball 30 (FIG. 1B) on a terminal portion 32 (FIG. 1A) of the wire 14. The contact ball 30 (FIG. 1B) is also known in the art as a "free air ball" (FAB).

Initially, as shown in FIG. 1A, the wire 14 is threaded through the bonding capillary 12 with the terminal portion 32 of the wire 14 extending from the bonding capillary 12.

Next, as shown in FIG. 1B, the electronic flame off (EFO) wand 18 is operated to form the contact ball 30 on the terminal portion 32 (FIG. 1A) of the bonding wire 14. A diameter of the contact ball 30 will be dependent on the diameter of the wire 14, with from 2 to 4 times the diameter of the wire 14 being representative. In addition, the diameter of the contact ball 30 will be approximately equal to the chamfered portion 36A of the opening 36 in the bonding capillary 12.

Next, as shown in FIG. 1C, the bonding capillary 12 is moved in the z direction towards the first contact 20A on the substrate 22, as indicated by arrow 34, which captures the contact ball 30 in the chamfered opening 36 (FIG. 1A).

Next, as shown in FIG. 1D, the contact ball 30 is pressed against the first contact 20A with a selected force, and ultrasonic energy is applied to bond the contact ball 30 to the first contact 20A and form a bonded contact 38 (FIG. 1E).

Next, as shown in FIG. 1E, the wire clamps 16 open, and the bonding capillary 12 is moved in x and z directions (and if required y direction), as indicated by arrows 40, 42 to perform a looping step.

Next, as shown in FIG. 1F, the bonding capillary 12 presses an intermediate portion 44 of the wire 14 against a second contact 20B on the substrate 22 with a selected force. In addition, ultrasonic energy is applied to form a second bonded contact in the form of a stitch bond 46 (FIG. 1G) between the wire 14 and the second contact 20B.

Next, as shown in FIG. 1G, the bonding capillary 12 is moved in the z direction away from the second contact 20B for a selected distance, as indicated by arrow 48, while the wire clamps 16 remain open.

Next, as shown in FIG. 1H, the wire clamps 16 are closed, which in combination with the movement of the bonding capillary 12, severs a terminal portion 50 of the wire 14 from the second contact 20B. In addition, this severing step forms a wire bonded wire 52 having the bonded contact 38 (FIG. 1E) bonded to the first contact 20A (FIG. 1E), and the stitch bond 46 (FIG. 1H) bonded to the second contact 20B (FIG. 1G).

As also shown in FIG. 1H, the terminal portion 50 of the wire 14 has a tail length TL, which is the distance from the end of the bonding capillary 12 to the end of the wire 14. The value of the tail length TL is determined by the movement of the bonding capillary 12, and by the timing of the closure of the wire clamps 16. The severing step is performed such that the tail length TL, is approximately equal to a thickness T (FIG. 2A) of a semiconductor substrate 54, plus the diameter of the contact ball 30 (FIG. 1B), plus a selected clearance distance. As an optional additional step, the terminal portion 50 of the wire 14 can be smoothed and rounded using a process, such as a partial flame off, to facilitate subsequent threading of the wire 14.

Referring to FIGS. 2A-2I, and FIGS. 3A-3G, steps in a method for fabricating a semiconductor component 86 (FIG. 3J) in accordance with the invention are illustrated.

Figure 3A:
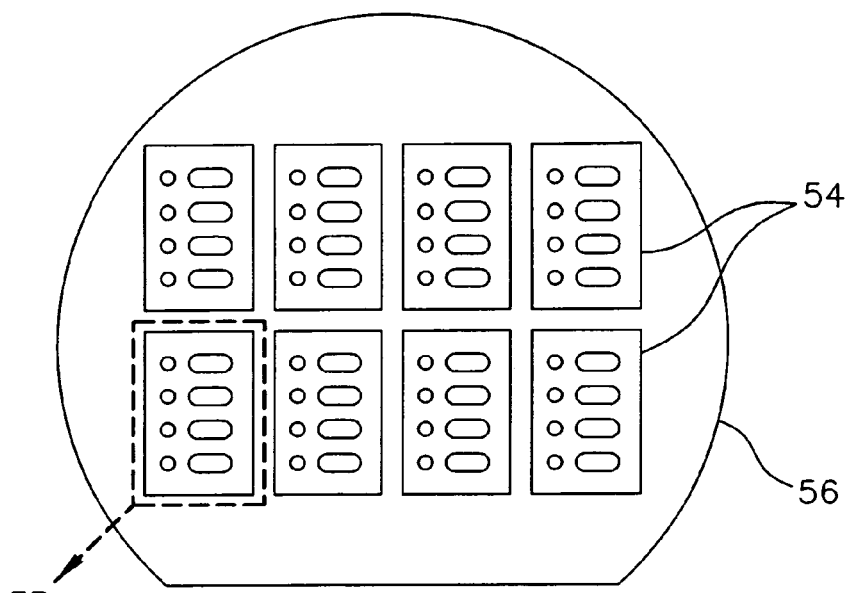
FIG. 3A is a schematic plan view taken along line 3A-3A of FIG. 2A illustrating a semiconductor wafer of the system.

As shown in FIG. 3A, in the illustrative embodiment the method is performed at the wafer level on a semiconductor wafer 56 (FIG. 3A) containing a plurality of the semiconductor substrates 54. However, it is to be understood that the method of the invention can be performed at the die level on singulated substrates, such as singulated bare dice and known good dice (KGD). Also in the illustrative embodiment, the semiconductor wafer 56 comprises a semiconductor material, such as silicon or gallium arsenide. In addition, the semiconductor substrates 54 are in the form of semiconductor dice having a desired electrical configuration, such as memory, application specific, or imaging and image sensing. However, it is to be understood that the method of the invention can be performed on other substrates including ceramic, plastic, tape, printed circuit board (PCB), metal lead frame, or flex circuit substrates.

Figure 3B:
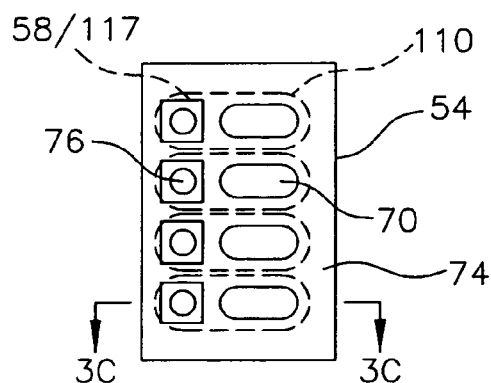
FIG. 3B is an enlarged schematic plan view taken along line 3B-3B of FIG. 3A illustrating a semiconductor substrate of the system.
Figure 3C:
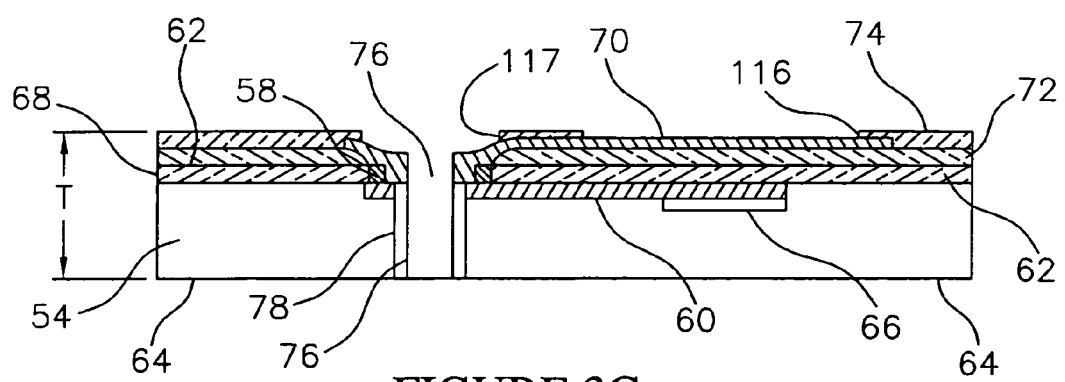
FIG. 3C is an enlarged schematic cross sectional view taken along line 3C-3C of FIG. 3B illustrating elements of the semiconductor substrate.

As shown in FIGS. 3B and 3C, the semiconductor substrate 54 includes a circuit side 62 ("first side" in some of the claims), and a back side 64 ("second side in some of the claims). In addition, the semiconductor substrate 54 includes a plurality of substrate contacts 58 on the circuit side 62, which in the illustrative embodiment comprise the device bond pads. The substrate contacts 58 can comprise a highly-conductive, wire-bondable metal, such as aluminum, or a wire bondable and solderable metal, such as copper, or a combination of metals, such as solder coated metals. For simplicity, the semiconductor substrate 54 is illustrated with only five substrate contacts 58 arranged in a single row. However, in actual practice the semiconductor substrate 54 can include tens of substrate contacts 58 arranged in a desired configuration, such as a center array, an edge array or an area array.

As shown in FIG. 3C, the substrate contacts 58 are in electrical communication with internal conductors 60 on the circuit side 62 of the semiconductor substrate 54. In addition, the internal conductors 60 are in electrical communication with integrated circuits 66 in the semiconductor substrate 54. Further, a die passivation layer 68 on the circuit side 62 protects the internal conductors 60 and the integrated circuits 66. The die passivation layer 68 can comprise an electrically insulating material, such as BPSG (borophosphosilicate glass), a polymer or an oxide. All of the element of the semiconductor substrate 54 including the internal conductors 60, the integrated circuits 66, and the passivation layer 68, can be formed using well known semiconductor fabrication processes.

As shown in FIGS. 3B and 3C, the semiconductor substrate 54 also includes a plurality of elongated RDL (redistribution layer) contacts 70 in electrical communication with the substrate contacts 58. The RDL contacts 70 are formed by a patterned redistribution layer on the circuit side 62. The RDL contacts 70 can comprise a highly-conductive, wire-bondable metal, such as aluminum, or a wire bondable and solderable metal, such as copper, or a combination of metals, such as solder coated metals.

Redistribution layers are widely used in semiconductor manufacture to redistribute standard patterns of substrate contacts 58 into area arrays for terminal contacts. An exemplary redistribution layer might include "fan out" or "fan in" RDL conductors and terminal contact pads. In addition to redistributing the pattern of the substrate contacts 58, the RDL contacts 70 provide additional connection points for testing, such as probe testing of the semiconductor substrate 54. U.S. Pat. No. 6,380,555 B1, entitled "Bumped Semiconductor Component Having Test Pads, And Method And System For Testing Bumped Semiconductor Components", which is incorporated herein by reference, describes an exemplary RDL circuit with additional test pads.

The RDL contacts 70 (FIG. 3C) can comprise a same metal as the substrate contacts 58, or alternately different metals than the substrate contacts 58. In addition, the RDL contacts 70 can include an additional solder layer, such as a lead free low melting point solder alloy, configured to facilitate a subsequent wire bonding step. Also the additional solder layer can be configured to melt at a temperature which is lower than that of the wire 14, such that the wire is better able to maintain it's strength during wire bonding.

The semiconductor substrate 54 also includes an inner RDL insulating layer 72 between the RDL contacts 70 and the die passivation layer 68, and an outer RDL insulating layer 74 on the inner RDL insulating layer 72 and on the RDL contacts 70. The inner RDL insulating layer 72, and the outer RDL insulating layer 74, can comprise an electrically insulating polymer, such as polyimide. Further, the outer RDL insulating layer 74 includes openings 116 which align with portions of the RDL contacts 70, and openings 117 which align with the substrate contacts 58. As another option, the openings 116 and 117 can be combined into single elongated openings.

As also shown in FIGS. 3B and 3C, through vias 76 extend through the RDL contacts 70, through the substrate contacts 58, and through the semiconductor substrate 54 to the back side 64 thereof. The vias 76 include via insulating layers 78 (FIG. 3C) formed on inside diameters thereof, which electrically insulate the vias 76 from the integrated circuits 66 and other electrical elements contained in the semiconductor substrate 54. The insulating layers 78 can comprise an electrically insulating material such as a polymer (e.g., polyimide or parylene) or an oxide (e.g., $SiO_2$).

The vias 76 (FIG. 3C) can be formed using an etching process, a laser machining process, an ion milling process, a mechanical process (e.g., drilling, grinding, abrasion), or combinations of any of these processes. For example, the vias 76 can be formed using a dry etch process, such as a reactive ion etching (RIE) process.

Another method for forming the vias 76 combines etching and laser machining processes. For example, an etch mask (not shown) and an etching process can be used to form the vias 76 through the RDL contacts 70 and the substrate contacts 58. Depending on the material of the RDL contacts 70 and the substrate contacts 58, a wet etchant can be used. For RDL contacts 70 and substrate contacts 58 made of aluminum, one suitable wet etchant is $H_3PO_4$. Following etching through the RDL contacts 70 and the substrate contacts 58, a laser machining process can be used to form the vias 76 through the semiconductor substrate 54. One suitable laser system for performing the laser machining step is manufactured by XSIL LTD of Dublin, Ireland, and is designated a Model No. XISE 200. Another suitable laser system for performing the laser machining step is manufactured by Electro Scientific, Inc., of Portland, Oreg. and is designated a Model No. 2700. Following the laser machining step, a cleaning step can be performed in which the vias 76 are cleaned using a suitable wet or dry etchant. One suitable wet etchant with the semiconductor substrate 54 comprising silicon is tetramethylammoniumhydroxide (TMAH).

The insulating layers 78 (FIG. 3C) can also be formed using techniques that are known in the art, such as polymer deposition or oxide growth. Each insulating layer 78 has a thickness that is less than the diameter of a via 76, such that only the sidewalls 100 (FIG. 3D) of the via 76 are coated. A thickness range for the insulating layers 78 can be from 0.10 µm to 100 µm or greater.

For forming the insulating layers 78 (FIG. 3C), parylene polymers can be deposited from the vapor phase by a process similar to vacuum metallization at pressures of about 0.1 torr. Suitable polymers include parylene C, parylene N, and parylene D. Parylene is available from Advanced Coating of Tempe, Ariz. One suitable deposition apparatus is a portable parylene deposition system, designated a model PDS 2010 LABCOATER 2, manufactured by Specialty Coating Systems, of Indianapolis, Ind. As another example, silicon dioxide can be grown by exposure of the semiconductor substrate 54 within the vias 76 to oxygen at an elevated temperature (e.g., 950° C.).

Other suitable processes for forming the vias 76 and the insulating layers 78 are described in U.S. Pat. No. 6,828,175 B2, entitled "Semiconductor Component With Backside Contacts And Method Of Fabrication", which is incorporated herein by reference.

Each via 76 (FIG. 3C) has a selected inside diameter which is about 1.5 to 3 times larger than the outside diameter of the wire 14 (FIG. 2A). In the illustrative embodiment, the wire 14 (FIG. 2A) has an outside diameter of about 25 µm, and the vias 76 (FIG. 3C) have an inside diameter of about 50 µm. In addition, a length of each via 76 (FIG. 3C) is dependent on an overall thickness T of the semiconductor substrate 54 (FIG. 3C). A representative range for the thickness T of the semiconductor substrate 54 (FIG. 3C) can be from about 50 µm to 725 µm depending on whether the wafer 56 (FIG. 3A) has a standard thickness or has been thinned. In addition, the thickness T will include the thickness of the semiconductor material which forms the semiconductor substrate 54 (FIG. 3C), and the thickness of any additional elements such as the RDL insulating layers 72, 74 (FIG. 3C) on the semiconductor substrate 54 (FIG. 3C).

As shown in FIG. 2A, the bonding capillary 12 is initially set up as previously described with the terminal portion 50 of the wire 14 having the tail length TL. In addition, an alignment step is performed in which the bonding capillary 12 is moved to a position in which the terminal portion 50 of the wire 14 aligns with the center of a selected via 76. The alignment step can be performed using the alignment system 26 (FIG. 1A), and the controller 24 (FIG. 1A) loaded with a program containing information on the locations of the substrate contacts 58. In addition, the diameter of the via 76 must be large enough relative to the diameter of the wire 14 to accommodate alignment tolerances of the alignment system 26 (FIG. 1A).

Figure 2B:
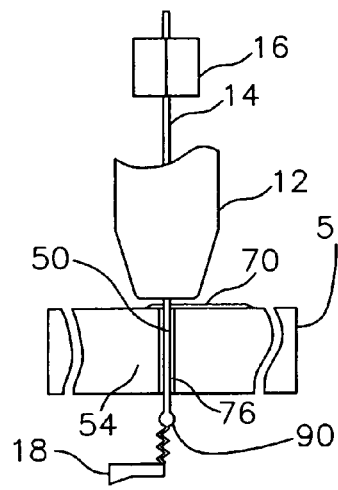

Next, as shown in FIG. 2B, a threading step is performed in which the bonding capillary 12 is moved downward in the direction of arrow 88 (FIG. 2A) to thread the terminal portion 50 of the wire 14 through the via 76. With the tail length TL (FIG. 2A) properly selected, the terminal portion 50 of the wire 14 projects from the back side 64 of the semiconductor component 54 by a predetermined distance.

As an alternative to performing the threading step by threading the terminal portion 50 of the wire 14 with the tail length TL (FIG. 2A) into the via 76, the bonding capillary 12 can be set up with the end of the wire 14 flush with the chamfered portion 36A (FIG. 1A) of the opening 36 (FIG. 1A) in the bonding capillary 12. The opening 36 (FIG. 1A) can then be aligned with the via 76, and the wire feed mechanism 17 (FIG. 1A) operated to feed the end of the wire 14 through the via 76 until it extends from the back side 64 (FIG. 3C) of the semiconductor substrate 54 (FIG. 2A). In this case, the wire feed mechanism 17 can comprise a mechanical wire feeding mechanism, such as a roller feed mechanism, or a linear motion clamp. This arrangement can be used in close tolerance applications, where it may be difficult to align the terminal portion 50 with the selected tail length TL, and thread the full tail length TL through the via 76.

As also shown in FIG. 2B, a ball forming step is performed in which the EFO wand 18 of the wire bonder 10 (FIG. 1A) is used to form a contact ball 90 on the end of the terminal portion 50 of the wire 14. In addition, the contact ball 90 has an outside diameter that is larger than the inside diameter of the via 76. The ball forming step can be controlled using programmable EFO process parameters, such that a diameter of the contact ball 90 is from about 2 to 4 times the diameter of the via 76. In addition, provisions can be made to insure that the electronic spark goes only to the wire. For example, the EFO wand 18 can include a grounded metallic shield which prevents the electronic spark from contacting the semiconductor wafer 56. Further, the wire 14 can be grounded to the wire bonder 10 (FIG. 1A) to insure the electronic spark does not jump to the semiconductor wafer 56 or the semiconductor substrate 54. As another alternative, the ball forming step can be performed using a forming gas torch, such as a hydrogen gas torch, as is known in the art.

Figure 2C:
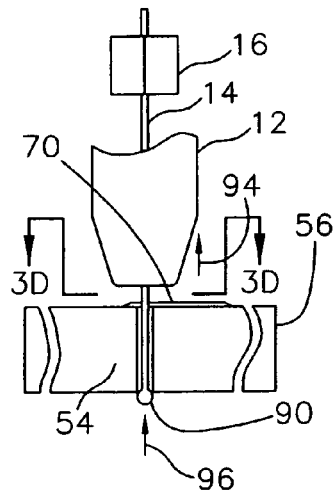

Next, as shown in FIG. 2C, a pulling and wedging step is performed in which the bonding capillary 12 is moved upward as indicated by arrow 94. Movement of the bonding capillary 12 also moves the contact ball 90 as indicated by arrow 96, and wedges the contact ball 90 into the via 76. The pulling and wedging step is performed with the wire clamps 16 closed, and is substantially similar to the ball capture step previously described and shown in FIG. 1C. However, in this case, rather than being captured by the bonding capillary 12, the contact ball 90 is pulled against the back side 64 (FIG. 3C) and wedged into the via 76 with a force exerted by the bonding capillary 12. Gas pressures above and below the semiconductor substrate 54 can also be used to move and wedge the contact ball 90 into the via 76.

Figure 3D:
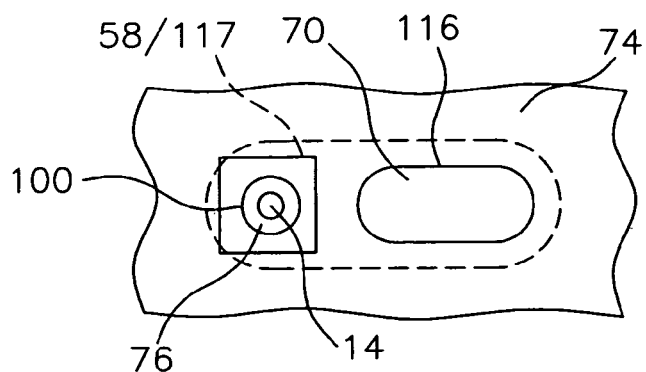
FIG. 3D is an enlarged schematic plan view taken along line 3D-3D of FIG. 2C illustrating elements of the semiconductor substrate following a threading step of the method.

FIG. 3D illustrates the wire 14 in the via following the pulling and wedging step. Although the contact ball 90 (FIG. 2C) is wedged into the via 76 (FIG. 2C), the wire 14 (FIG. 3D) remains unattached to the sidewall 100 (FIG. 3D) of the via 76 (FIG. 2C). With this arrangement, the wire 14 is free to move within the via 76, such that in the completed component 86 (FIG. 3J) stresses are not generated during temperature cycling, due to the different thermal coefficients of expansion (TCE) of the wire 14 and the semiconductor substrate 54.

Figure 2D:
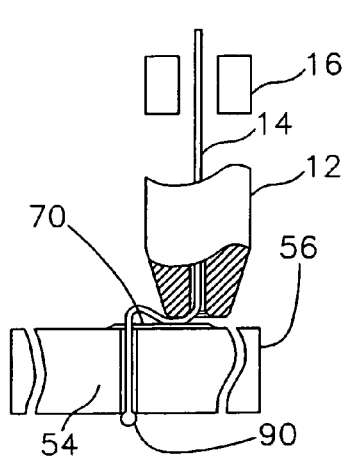

Next, as shown in FIG. 2D, a looping step is performed in which the wire clamps 16 are opened, and the bonding capillary 12 is moved in x and z directions (and also in the y direction if required) into alignment with the RDL contact 70 (FIG. 3C). The looping step can be performed using the alignment system 26 (FIG. 1A) and the controller 24 (FIG. 1A), substantially as previously described and shown for the looping step of FIG. 1F. In this case, the controller 24 (FIG. 1A) is loaded with a program containing information on the locations of the RDL contacts 70. Also as previously described, the wire clamps 16 remain open during the looping step.

Figure 2E:
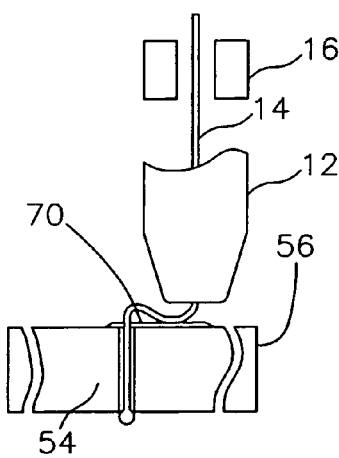

Next, as shown in FIG. 2E, a bonded contact forming step is performed in which a bonded contact 92 (FIG. 2F) is formed between an intermediate portion of the wire 14 and the RDL contact 70. In the illustrative embodiment, the bonded contact 92 comprises a stitch bond formed using pressure and ultrasonic energy exerted by the capillary tool 12, substantially as previously described and shown in FIG. 1G. Also as previously described, the wire clamps 16 remain open during the bonded contact forming step.

Figure 2F:
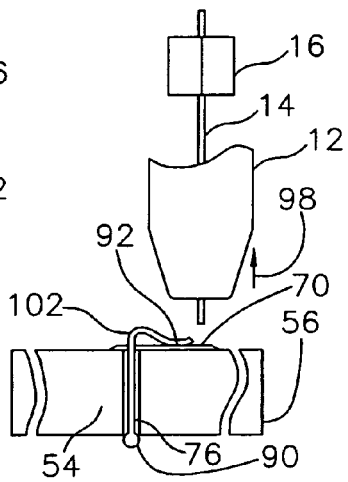
Figures 2G, 2H, 2I:
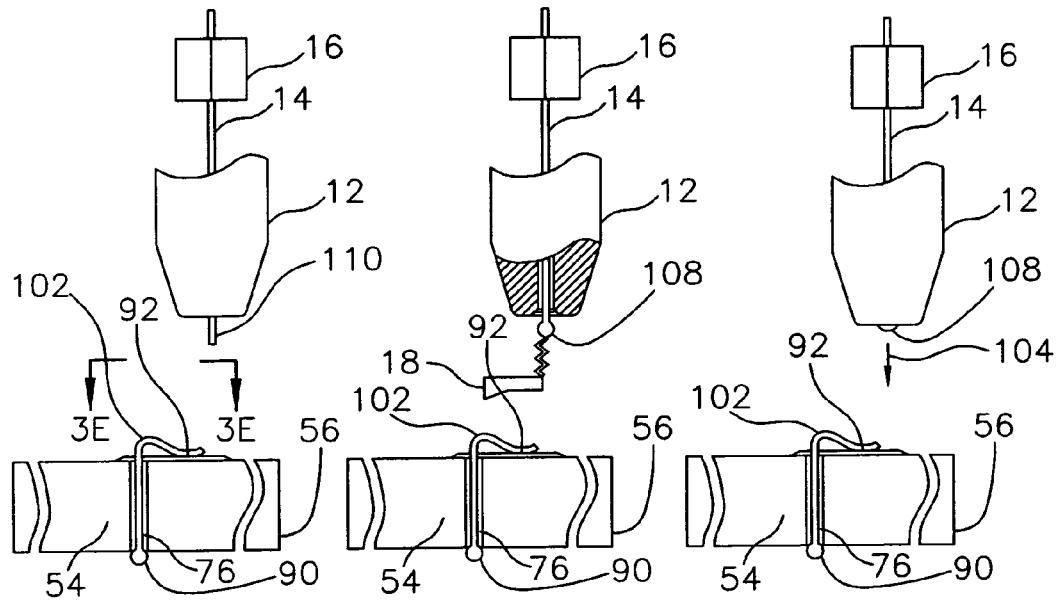

Next, as shown in FIGS. 2F and 2G, a severing step is performed in which the wire clamps are closed, and the bonding capillary 12 is moved as indicated by arrow 98 (FIG. 2F) to sever the wire 14 from the bonded contact 92. The severing step can be performed substantially as previously described and shown for the severing step of FIG. 1H. This severing step forms a terminal portion 110 (FIG. 2G) of the wire 14 which extends from the bonding capillary 12. As previously described, an optional additional smoothing step can be performed using heat or a partial electronic flame off to smooth the terminal portion 110.

Figure 3E:
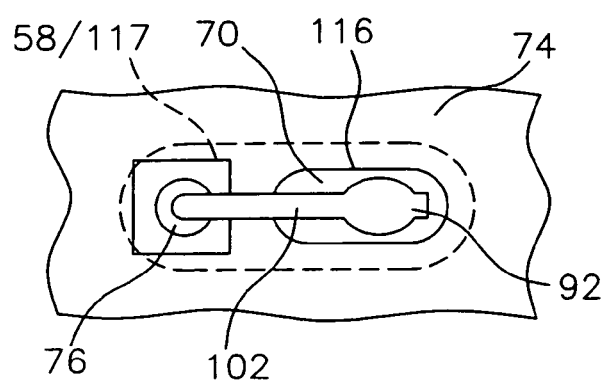
FIG. 3E is an enlarged schematic plan view taken along line 3E-3E of FIG. 2G illustrating elements of the semiconductor substrate following a bonded contact forming step of the method.

FIG. 3E illustrates the resultant through wire interconnect 102. The through wire interconnect 102 includes the bonded contact 92 bonded to the RDL contact 70 on the circuit side 62 of the semiconductor substrate 54. In addition, the through wire interconnect 102 includes the contact ball 90 (FIG. 2F) wedged into the via 76 on the back side 64 (FIG. 2F) of the semiconductor substrate 54.

Next, as shown in FIGS. 2H-2K, optional additional stud bumping steps can be performed for forming a stud bump 106 (FIG. 2K) on the bonded contact 92. The stud bump 106 (FIG. 2K), in addition to providing an external contact point to the through wire interconnect 102, also provides a security bond for the bonded contact 92.

In FIGS. 2H-2K, the stud bumping steps are performed using the same wire bonder 10 (FIG. 1A). However, as will be further explained, the wire bonder 10 can be modified with two bonding capillaries, with a first bonding capillary 12A (FIGS. 5A-5B) operating on the circuit side 62 of the semiconductor substrate 54, and a second bonding capillary 12B (FIG. 5A-5B) operating on the back side 64 of the semiconductor substrate 54.

Figures 2J, 2K, 2L:
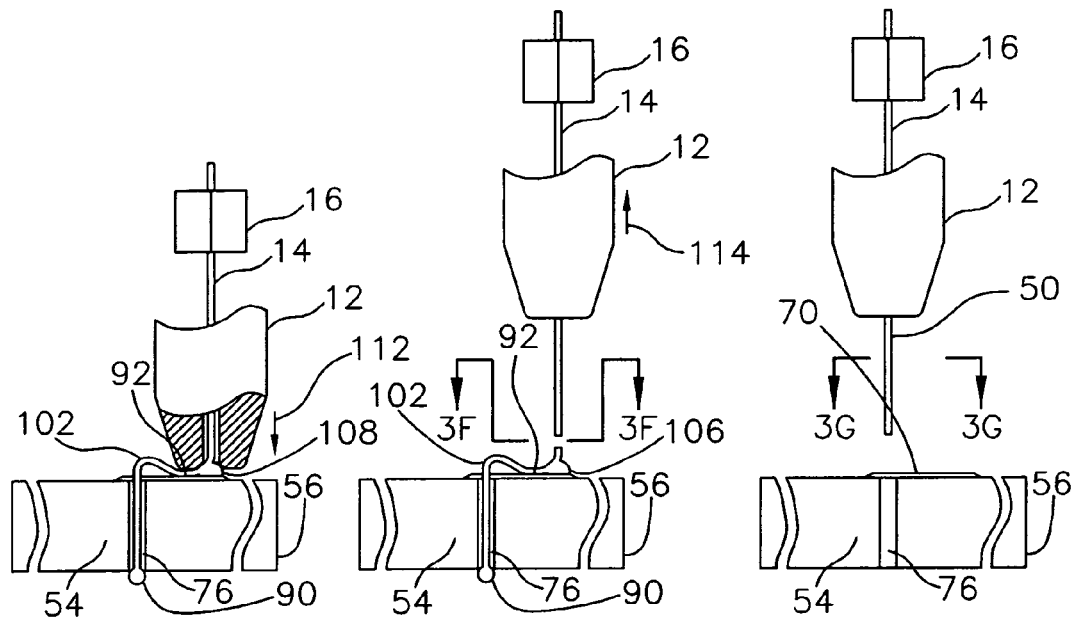

As an alternative to using a single wire bonder 10 (FIG. 1A), a separate stud bumper 124 (FIG. 4B) can be used to form the stud bump 106 (FIG. 2K). One suitable stud bumper is a "WAFER PRO PLUS" high speed large area stud bumper manufactured by Kulicke & Soffa Industries Inc. of Willow Grove, Pa. With a separate stud bumper, the wire 14 can comprise a standard material, such as a solder alloy, copper, aluminum or palladium, and the stud bump 106 (FIG. 2K) can comprise a non oxidizing material, such as gold.

Referring to FIG. 2H, in the illustrative embodiment, the EFO wand 18 of the wire bonder 10 (FIG. 1A) is used to form a contact ball 108 (FIG. 2H) on the terminal portion 110 (FIG. 2G) of the wire 14, substantially as previously described and shown in FIG. 1B.

Next, as shown in FIG. 2I, the bonding capillary 12 is moved to capture the contact ball 108 substantially as previously described and shown in FIG. 1C. Following capturing of the contact ball 108, the bonding capillary is aligned with the bonded contact 92, and the bonding capillary 12 is moved towards the bonded contact 92, as indicated by arrow 104.

Next, as shown in FIG. 2J, force and ultrasonic energy are applied by the bonding capillary 12, as indicated by arrow 112, to bond the contact ball 108 to the bonded contact 92.

Figure 3F:
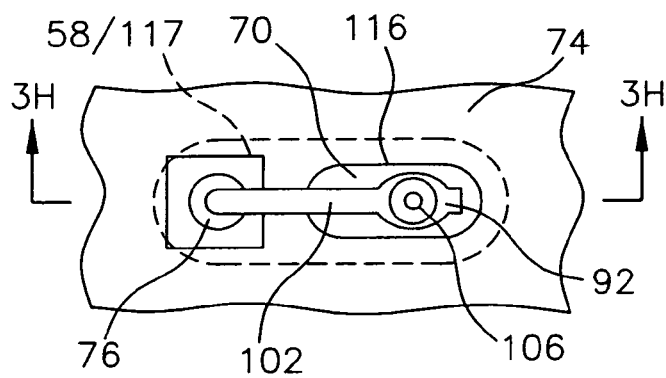
FIG. 3F is an enlarged schematic plan view taken along line 3F-3F of FIG. 2K illustrating elements of the semiconductor substrate following a stud bump forming step of the method.
Figure 3G:
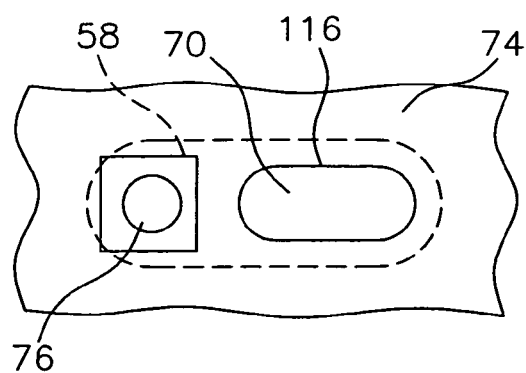
FIG. 3G is an enlarged schematic plan view taken along line 3G-3G of FIG. 2I illustrating elements of the semiconductor substrate prior to a new cycle of the method.
Figure 3H:
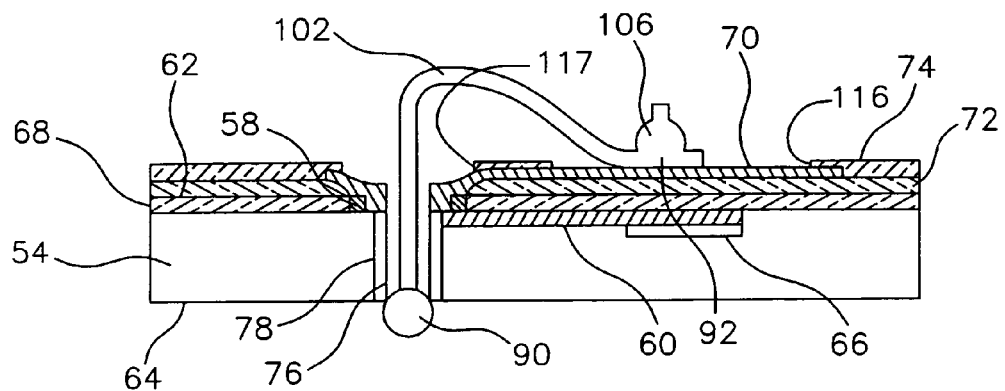
FIG. 3H is an enlarged schematic cross sectional view taken along line 3H-3H of FIG. 3F illustrating elements of the semiconductor substrate following the stud bump forming step of the method.

Next, as shown in FIG. 2K, the bonding capillary 12 is moved away from the bonded contact 92, as indicated by arrow 114, leaving a stud bump 106 (FIG. 2K) on the bonded contact 92. In addition, the bonding capillary 12 moves a selected distance with the wire clamps 16 open, such that a terminal portion 50 (FIG. 2L) having a selected tail length TL (FIG. 2A) is formed. FIG. 3F illustrates the through wire interconnect 102 with the stud bump 106 in a plan view. FIG. 3H illustrates the through wire interconnect 102 with the stud bump 106 on the semiconductor substrate 54 in a cross sectional view.

Next, as shown in FIG. 2L, the bonding capillary 12 is moved and aligned with another via 76 and the steps of FIGS. 2B-2K are repeated as required. FIG. 3G illustrates the next via 76, the substrate contact 58 and the RDL contact 70 prior to the next threading step.

Figure 3I:
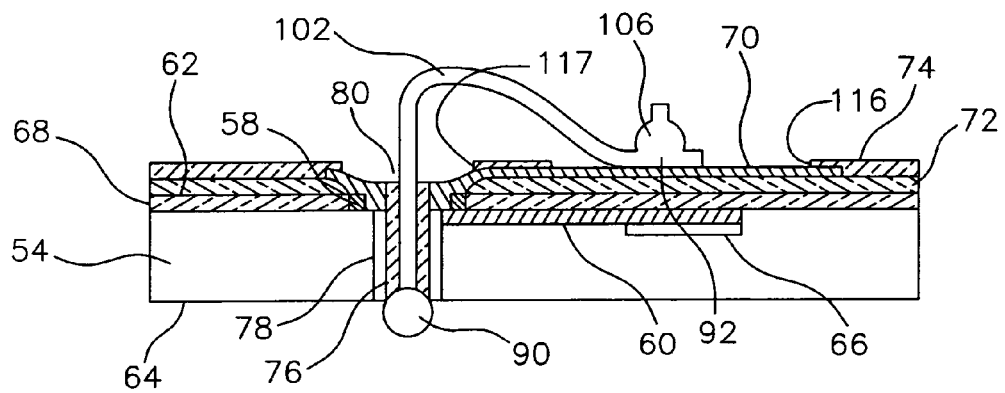
FIG. 3I is an enlarged schematic cross sectional view equivalent to FIG. 3H illustrating elements of the semiconductor substrate following an optional wire encapsulating step of the method.

Referring to FIG. 3I, the through wire interconnect 102 and the semiconductor substrate 54 are illustrated in cross section after an optional wire encapsulating step has been performed. In FIG. 3I a wire encapsulant 80 has been deposited in the via 76 to encapsulate the portion of the through wire interconnect 102 in the via 76. The wire encapsulant 80 can comprise a polymer, such as a UV or thermal curable epoxy, deposited into the via 76 using a suitable process such as capillary injection, or screen printing. Following deposition, the wire encapsulant 80 can be cured to harden. The wire encapsulant 80 attaches the through wire interconnect 102 to the via 76, performing a locking function, and providing another layer of electrically insulating dielectric material between the through wire interconnect 102 and the semiconductor substrate 54. In addition, the wire encapsulant 80 electrically insulates the contact ball 90, and prevents shorting between the contact ball 90 and the semiconductor substrate 54. The wire encapsulant 80 can also be configured to adjust a capacitance of the through wire interconnect 102.

As another alternative, a no-sweep encapsulant 246 (FIG. 13G) can be deposited on the through wire interconnects 102 to prevent wire sweep. For example, Kulicke & Soffa manufactures a product under the trademark "NOSWEEP" encapsulant, which can be dispensed and cured during operation of the wire bonder 10 (FIG. 1A).

Figure 3J:
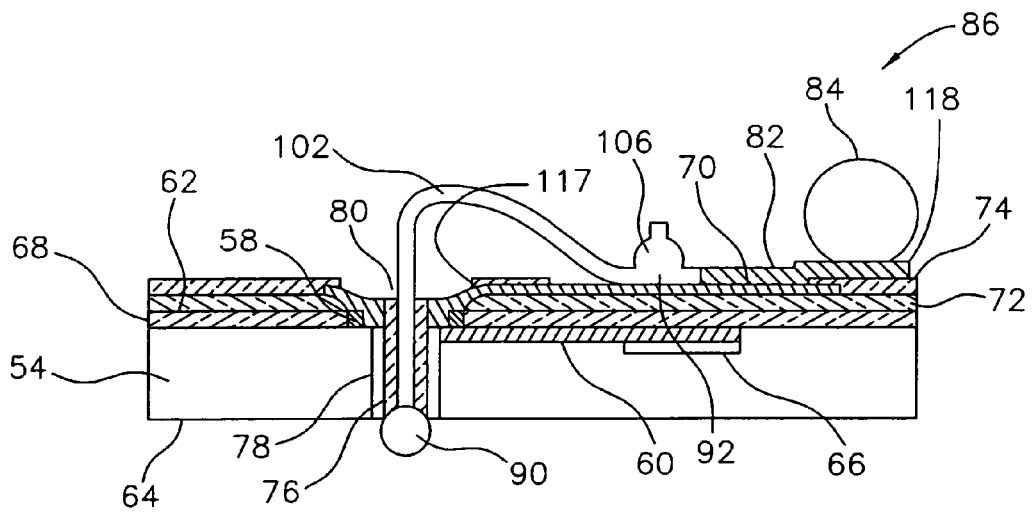
FIG. 3J is an enlarged schematic cross sectional view equivalent to FIG. 3H illustrating elements of the semiconductor substrate following an optional terminal contact forming step of the method.

Referring to FIG. 3J, the through wire interconnect 102, and the semiconductor substrate 54, are illustrated in an enlarged cross sectional view after an optional step has been performed. During the optional step, terminal contacts 84, such as flip chip solder balls (OLB balls) or FCOM balls, are formed on the semiconductor substrate 54 in electrical communication with the through wire interconnect 102. In FIG. 3J, conductors 82 and terminal contact bonding pads 118 have been formed on the outer RDL insulating layer 74 in electrical communication with the bonded contacts 92 and with the RDL pads 70. In addition, terminal contacts 84 have been formed on the terminal contact bonding pads 118. In FIG. 3J, the conductors 82 and the terminal contact bonding pads 118 are shown as separate layers for illustrative purposes. However, the conductors 82 and the terminal contact bonding pads 118 are preferably part of the redistribution layer that forms the RDL pads 70, and are preferably formed prior to the threading step shown in FIG. 2A. In addition, the terminal contacts 84 can be mounted in openings through the outer RDL insulating layer 74 directly to RDL conductors having a same thickness as the RDL contacts 70.

The conductors 82 (FIG. 3J) and the terminal contact bonding pads 118 (FIG. 3J) can be formed of a highly conductive metal using a metallization process, such as etching or deposition through a mask. In addition, the conductors 82 (FIG. 3J) can have a fan out configuration substantially as shown, or a fan in configuration. Further, the terminal contact bonding pads 118 (FIG. 3J) and the terminal contacts 84 (FIG. 3J) can be formed in an area array, such as a grid array, an edge array or a center array.

The terminal contacts 84 (FIG. 3J) can be formed using a suitable process such as solder ball bonding or stud bumping. As will be further explained, the terminal contacts 84 can be used to provide external connection points and a flip chip bonding structures to a circuit board or other supporting substrate. Following the optional additional steps, the semiconductor substrate 54 (FIG. 3A) can be singulated from the wafer 56 (FIG. 3A) using a suitable process such as cutting, shearing, etching or water jetting.

As shown in FIG. 3J, the completed semiconductor component 86 includes the semiconductor substrate 54 containing the integrated circuits 66. In addition, the semiconductor component 86 includes the through wire interconnect 102 in electrical communication with the substrate contacts 58, the RDL contacts 70 and the integrated circuits 66. The through wire interconnect 102 includes the contact ball 90 (FIG. 2F) wedged into the via 76 on the back side 64 (FIG. 2F) of the semiconductor substrate 54. The through wire interconnect 102 also includes the bonded contact 92 with the stud bump 106 on the RDL contact 70 on the circuit side 62. As will be further explained, the contact ball 90 and the bonded contact 92 permit the semiconductor component 86 to be stacked on other components. The semiconductor component 86 also includes terminal contacts 84 on the circuit side 62 in electrical communication with the through wire interconnect 102 and with the integrated circuits 66. In addition, the semiconductor component 86 has a chip scale outline which matches that of the semiconductor substrate 54.

Figure 4A:
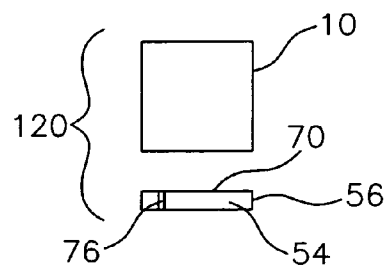
FIG. 4A is a block diagram of a system for performing the method of the invention.

Referring to FIG. 4A, a system 120 for performing the method of the invention is illustrated in a block diagram. The system 120 includes the wire bonder 10 which includes the bonding capillary 12 (FIG. 1A), the wire clamps 16 (FIG. 1A), the alignment system 26 (FIG. 1A), the controller 24 (FIG. 1A) and the EFO wand 18 (FIG. 1B). Each of these elements functions substantially as previously described. The system also includes the semiconductor wafer 56 containing the semiconductor substrate 54 having the via 76, the RDL contacts 70, and all of the other previously described elements.

Figure 4B:
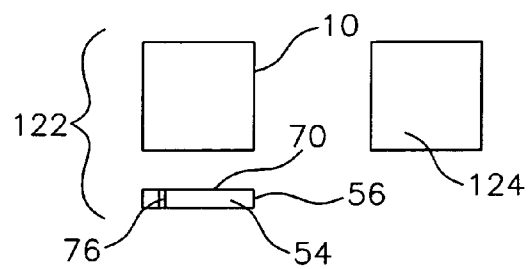
FIG. 4B is a block diagram of an alternate embodiment system for performing the method of the invention.

Referring to FIG. 4B, an alternate embodiment system 122 includes essentially the same elements as the system 120 (FIG. 4A), but also includes a stud bumper 124 for performing the stud bumping step in which the stud bumps 106 (FIG. 2K) are formed on the bonded contacts 92 (FIG. 2K).

Figure 5A:
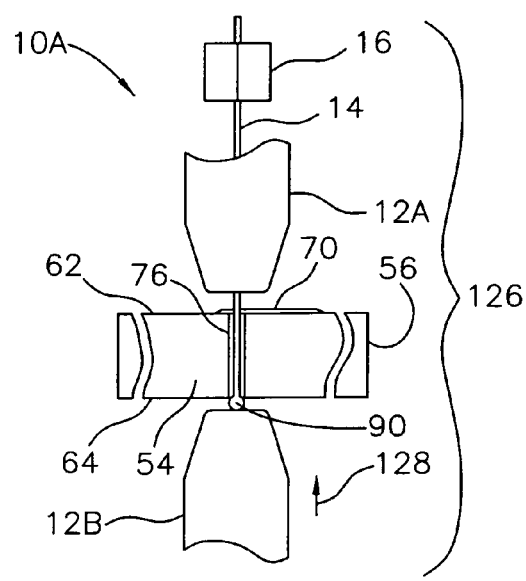
FIGS. 5A and 5B are schematic cross sectional views of another alternate embodiment system for performing the method of the invention.

Referring to FIG. 5A, an alternate embodiment system 126 includes a wire bonder 10A, which is substantially equivalent to the previously described wire bonder 10 (FIG. 1A). However, the wire bonder 10A includes a first bonding capillary 12A configured to perform steps of the invention from the circuit side 62 of the semiconductor substrate 54, and a second bonding capillary 12B configured to perform steps of the invention from the back side 64 of the semiconductor substrate 54. For example, the second bonding capillary 12B can be used to form, and then to exert a pressure on the contact ball 90, as indicated by arrow 128, to wedge the contact ball 90 in the via 76. Similarly, if the via 76 includes a metal layer the second bonding capillary 12B can be used to bond the contact ball 90 to the metal layer using ultrasonic or thermal energy.

Figure 5B:
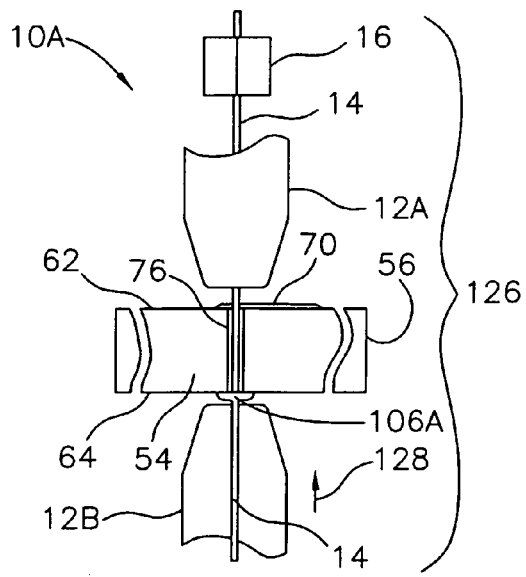

Referring to FIG. 5B, as another alternative, the system 126 and the second bonding capillary 128 can be used to form a stud bump 106A "on", or "in place of" the contact ball 90. The stud bump 106A can be substantially equivalent to the stud bump 106 (FIG. 3H) previously described. In addition, the stud bump 106A can be used to interconnect stacked components.

Figure 6:
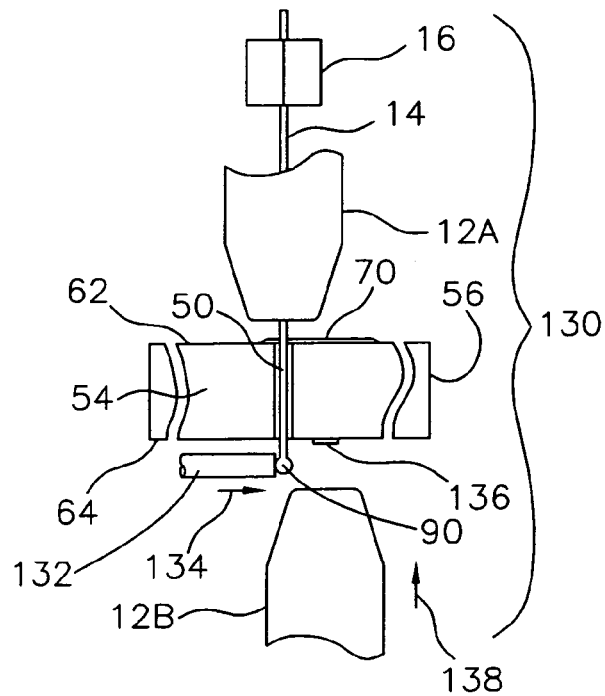
FIG. 6 is a schematic cross sectional view of another alternate embodiment system for performing the method of the invention.

Referring to FIG. 6, an alternate embodiment system 130 includes the two bonding capillaries 12A, 12B, and also includes a pusher mechanism 132 which is movable as indicated by arrow 138. The pusher mechanism 132 can be used to push the contact ball 90 onto a back side contact 136 on the semiconductor substrate 54. The second bonding capillary 12B can then be moved as indicated by arrow 138 to bond the contact ball 90 to the back side contact 136.

Figure 7A:
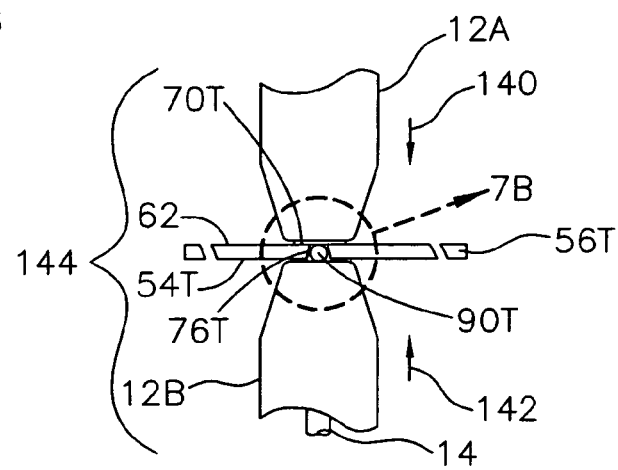
FIG. 7A is a schematic cross sectional view of another alternate embodiment system for performing the method of the invention.
Figure 7B:
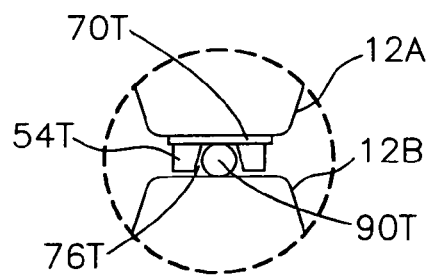
FIG. 7B is an enlarged portion of FIG. 7A taken along line 7B in FIG. 7A.

Referring to FIGS. 7A and 7B, an alternate embodiment system 144 includes the two bonding capillaries 12A, 12B configured substantially as previously described. The system 144 also includes a thinned semiconductor wafer 56T having a thinned semiconductor substrate 54T having a thickness of about 25 μm to 200 μm. The thinned semiconductor substrate 54T includes a via 76T and an RDL contact 70T, which are constructed substantially as previously described for the via 76 (FIG. 2A) and the RDL contact 70 (FIG. 2A). However, the via 76T does not extend through the RDL contact 70T, and the length of the via 76T is about the same as the diameter of a contact ball 90T. The second capillary 12B is configured to form the contact ball 90T from the wire 14, and to bond the contact ball 90T (and also another end of the wire 14, if desired), substantially as previously described. However, in this case the first bonding capillary 12A is configured as a "backing", "support" or "anvil" capillary, which as indicated by arrow 140 resists the pressure of the second bonding capillary 12B. Also with the alternate embodiment system 144, the RDL contact 70T can include a through hole allowing the bonding capillary 12A to feed the wire 14 through the hole, form a free air ball (FAB), pull away, make a wire loop, and then make a security or stud bond on the surface of RDL contact 70T. Both bonding capillaries 12A, 12B could form a bond on the outer and inner surfaces of the RDL contact 70T, or form a wire rivet through the RDL contact 70T. As another option, the second bonding capillary 12B can be configured as an electrically conductive spot welder such that the contact ball 90T can be welded to the back side of the RDL contact 70T.

Figure 8:
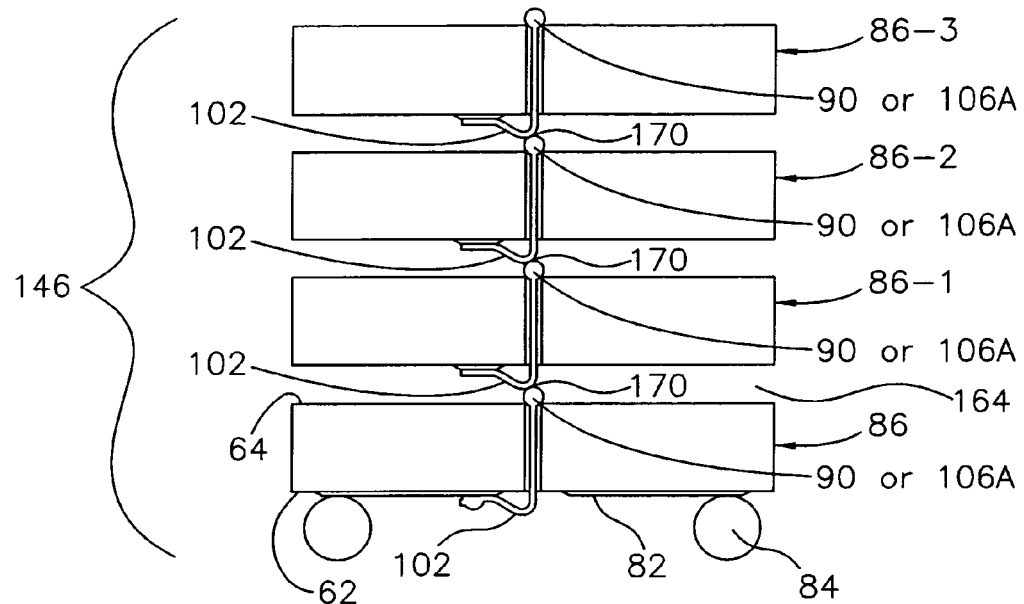
FIG. 8 is a schematic cross sectional view of a stacked component constructed in accordance with the invention.

Referring to FIG. 8, a stacked component 146 constructed in accordance with the invention is illustrated. The stacked component 146 includes the semiconductor component 86 with the through wire interconnects 102 having the contact balls 90 on the back side 64, and the conductors 82 and the terminal contacts 84 on the circuit side 62. In addition, three separate semiconductor components 86-1, 86-2 and 86-3 are stacked on the semiconductor component 86. The semiconductor components 86-1, 86-2 and 86-3 are substantially identical to the semiconductor component 86, but do not include the terminal contacts 84 or the conductors 82. The balls 90, or stud bumps 106A (FIG. 5B), and through wire interconnects 102 on adjacent components are bonded to one another forming bonded interconnect connections 170 there between. The bonded interconnect connections 170 can comprise solder joints, mechanical connections, welded connections, or conductive polymer connections formed between the contact balls 90 and the wires of the through wire interconnects 102. Also, an underfill material 162 (FIG. 10) can be formed in the gaps 164 between adjacent components.

Figure 9:
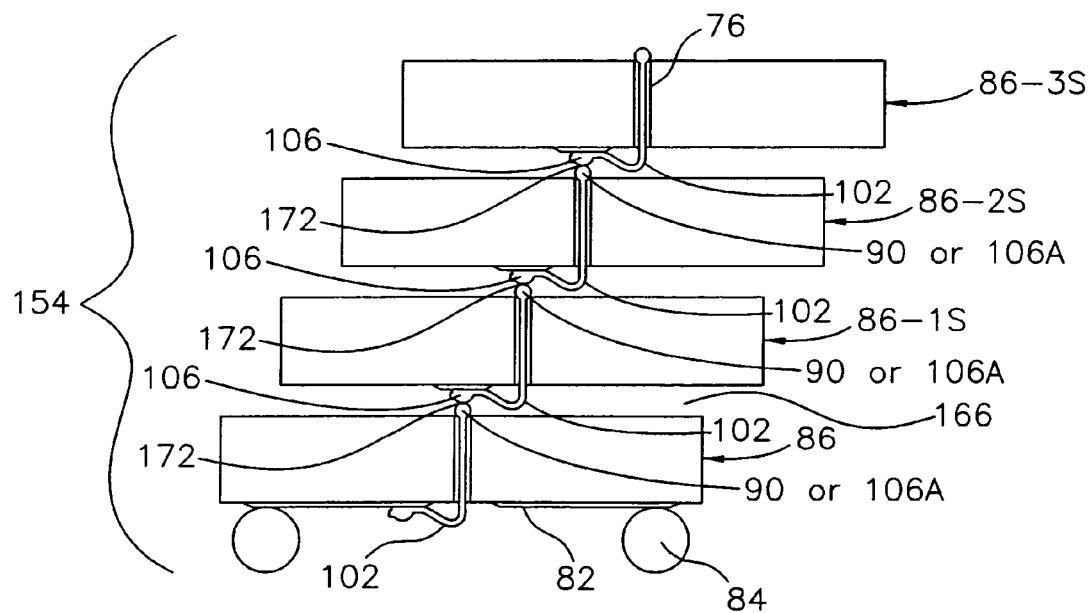
FIG. 9 is a schematic cross sectional view of a stacked, staggered component constructed in accordance with the invention.

Referring to FIG. 9, a stacked component 154 constructed in accordance with the invention is illustrated. The stacked component 154 includes the semiconductor component 86 with the through wire interconnects 102 having the contact balls 90 on the back side 64, and the conductors 82 and the terminal contacts 84 on the circuit side 62. In addition, three separate semiconductor components 86-1S, 86-2S and 86-3S are stacked on the semiconductor component 86. The semiconductor components 86-1S, 86-2S and 86-3S are substantially identical to the semiconductor component 86, but do not include the terminal contacts 84. In addition, the contact balls 90, or stud bumps 106A (FIG. 5B), and the through wire interconnects 102 on adjacent components are bonded to one another forming bonded interconnect connections 172 the between. However, in this embodiment the bonded interconnect connections 172 are between adjacent contact balls 90, or stud bumps 106A (FIG. 5B), and the stud bumps 106 of the bonded contacts 92 (FIG. 3J). The bonded interconnect connections 172 can comprise solder joints, mechanical connections, welded connections, or conductive polymer connections formed between the contact balls 90 and the stud bumps 106. In this embodiment, the semiconductor components 154, 86-1S, 86-2S and 86-3S are staggered by a distance approximately equal to the distance between the stud bumps 106 and the vias 76. In FIG. 9, the offset between adjacent components is not to scale, as this distance will typically be on the order of only about 100-300 µm.

Referring to FIG. 10, a stacked die component 148 includes a semiconductor die 150 stacked and bonded to the semiconductor component 86. The semiconductor die 150 includes die contacts 152 bonded to the contact balls 90, or stud bumps 106A (FIG. 5B), of the through wire interconnects 102, forming bonded interconnect connections 174 there between. The bonded interconnect connections 174 can comprise solder joints, mechanical connections, welded connections, or conductive polymer connections formed between the contact balls 90, or stud bumps 106A (FIG. 5B), and the die contacts 152. In addition, an underfill layer 162 such as a curable polymer, can be formed between the semiconductor component 86 and the semiconductor die 150.

Although all of the stacked components 146 (FIG. 8), 154 (FIG. 9) and 148 (FIG. 10) are constructed with the semiconductor component 86 being a singulated component, it is to be understood that the semiconductor component 86 can be contained on the semiconductor wafer 56 (FIG. 3A), such that wafer scale stacked components can also be provided.

Referring to FIGS. 11A and 11B, an alternate embodiment interconnect component 86I is illustrated. The interconnect component 86I is substantially identical to the semiconductor component 86 (FIG. 3J), but is configured for conducting test signals from the terminal contacts 84 through the through wire interconnects 102 to the balls 90, or stud bumps 106A (FIG. 5B). As shown in FIG. 11A, a device under test 156, such as a semiconductor die or wafer, includes test pads 160. As indicated by arrows 158, the device under test 156 can be moved into engagement with the interconnect substrate 86I using a suitable apparatus such as a probe tester or single die carrier. In this embodiment, the interconnect component 86I does not necessarily include the integrated circuits 66 (FIG. 3C), as it can be a passive element configured to make non bonded electrical connections 176 (FIG. 11B) with the device under test 156. In addition, the interconnect component 86I does not necessarily need to be made of a semiconductor material but can comprise a ceramic, a plastic material or a composite material. Also in this embodiment, the through wire interconnect 102 can optionally be free to move in the via 76 with the loop allowing flexure without fatigue. In this case, the through wire interconnect 102 can be springy enough in an unloaded state to keep the ball 90 in a position away from the outer surface of the interconnect component 86I. As another alternative, the through wire interconnect 102 can be encapsulated in the via 76 as previously described, but with the ball 90 free to move up and down in the z-direction. In addition, the ball 90 can be plated with a wear resistant metal having a high electrical conductivity. In this case, the ball 90 could function as a mini "POGO PIN" for use in probe cards and known good die (KGD) test sockets, with the via encapsulant protecting and preventing buckling of the through wire interconnect 86I.

Referring to FIG. 12, an alternate embodiment interconnect component 86IC is illustrated. The interconnect component 86IC is substantially identical to the interconnect component 86I (FIG. 11A). However, the interconnect component 86IC includes separate test contactors 186 in electrical communication with the through wire interconnects 102 configured to make non bonded electrical connections 178 with the test contacts 160 on the device under test 156. The test contactors 168 can comprise raised contacts with penetrating projections as described in U.S. Pat. No. 5,483,741 entitled "Method For Fabricating A Self Limiting Silicon Based Interconnect For Testing Bare Semiconductor Dice", which is incorporated herein by reference. Alternately, the test contactors 168 can be constructed as described in U.S. Pat. No. 5,931,685 entitled "Interconnect For Making Temporary Electrical Connections With Bumped Semiconductor Components", which is incorporated herein by reference.

Figure 13A:
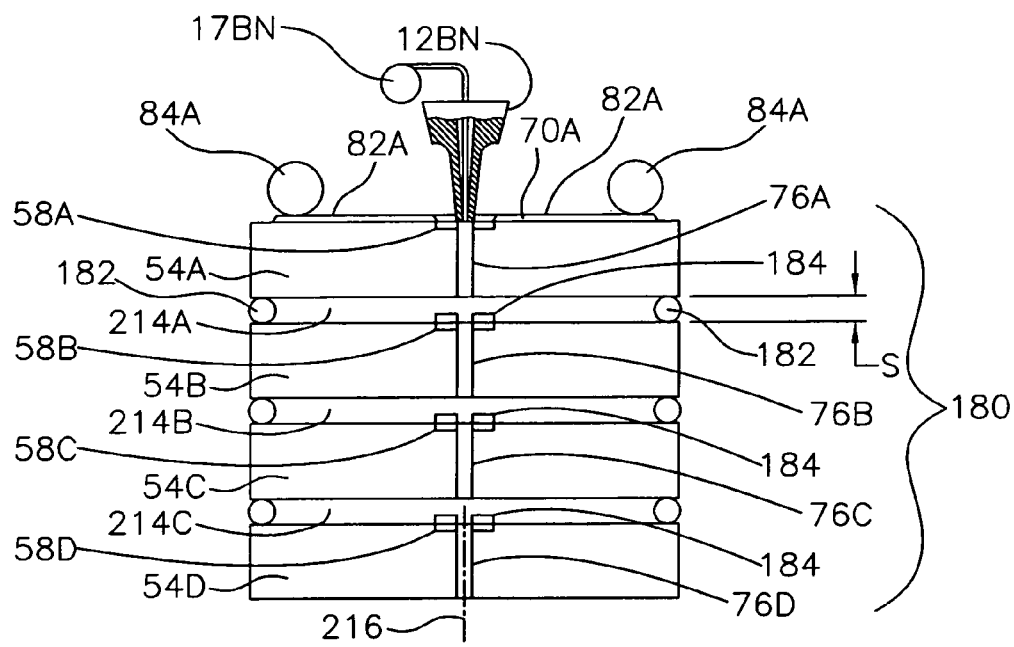
FIGS. 13A-13F are schematic cross sectional views illustrating steps in an alternate embodiment stacked method of the invention.
Figure 13B:
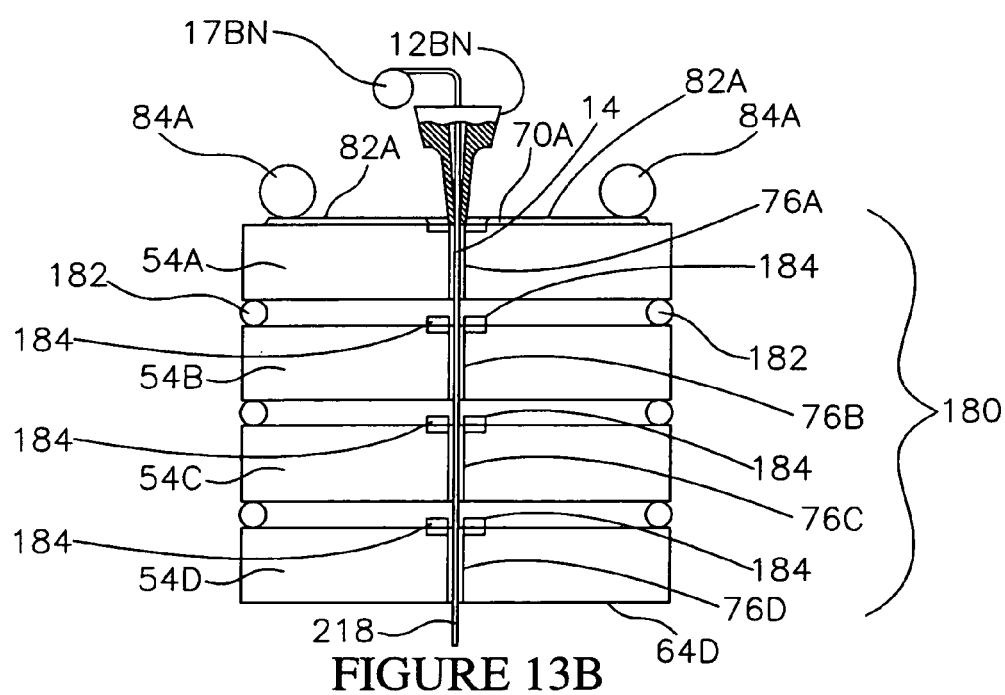
Figure 13C:
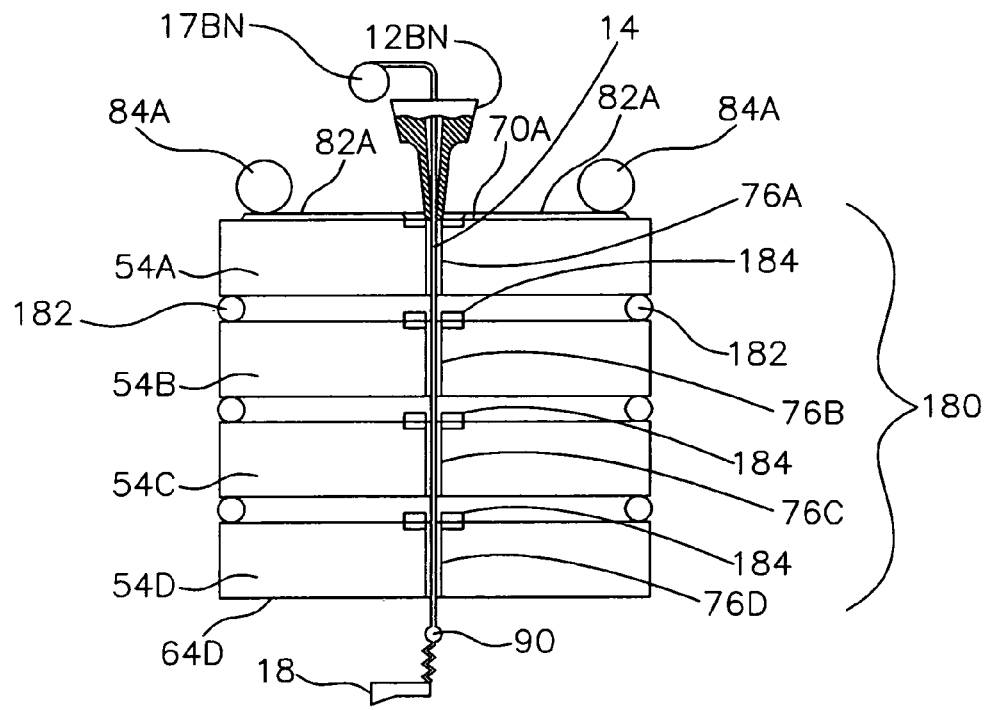
Figure 13D:
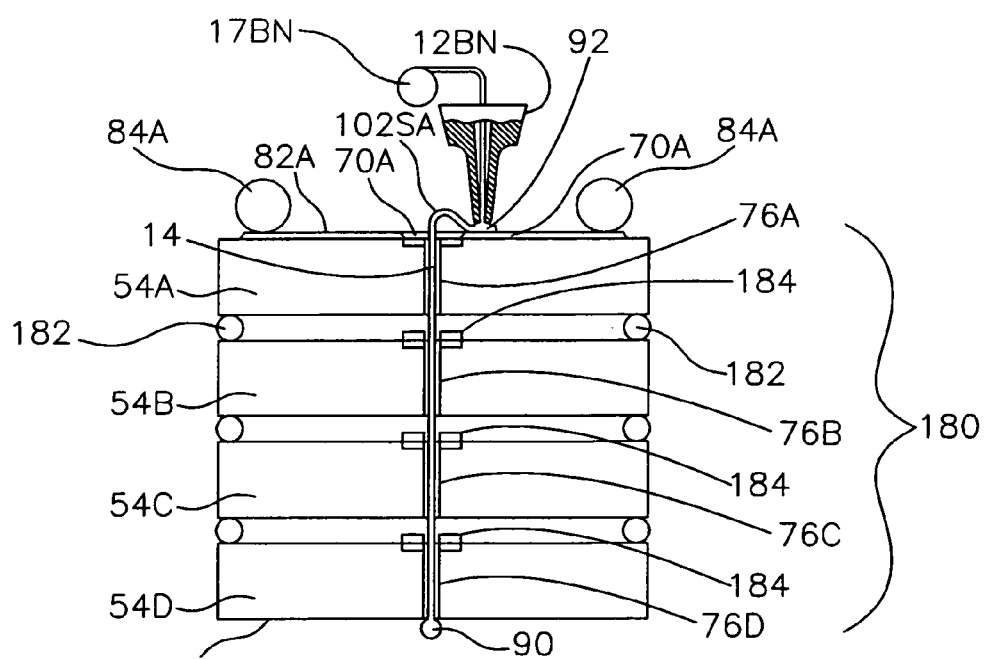
Figure 13E:
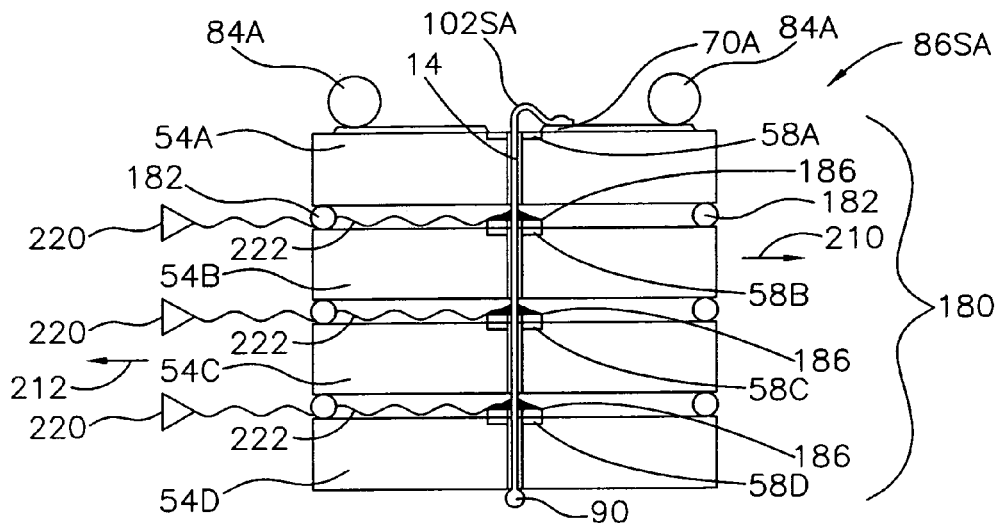

Referring to FIGS. 13A-13G, steps in an alternate embodiment stacked method are illustrated for forming a stacked array component 86SA (FIG. 13E). As with the previous embodiment, the stacked method can be performed at the wafer level on a semiconductor wafer 56 (FIG. 3A) containing a plurality of the semiconductor substrates 54. Alternately, the stacked method can be performed on singulated semiconductor substrates 54, such as bare dice or known good dice (KGD).

Initially, as shown in FIG. 13A, four semiconductor substrates 54A-54D are stacked with spacers 182 there between to form a stacked array 180. The uppermost substrate of the stacked array 180 (FIG. 13A) is termed herein as the first outer semiconductor substrate 54A. The lowermost substrate of the stacked array 180 (FIG. 13A) is termed herein as the second outer semiconductor substrate 54D. The middle substrates 54B and 54C of the stacked array 180 (FIG. 13A) are termed herein as the inner semiconductor substrates 54B and 54C.

The spacers 182 (FIG. 13A) can comprise a metal such as solder, or a polymer, such as an epoxy or resist. The spacers 182 can be formed directly on the semiconductor substrates 54A-54D, or on special pads (not shown) on the semiconductor substrates 54A-54D, using a process such as stud bumping, ball bonding, screen printing, dot shooting, nozzle deposition, or photopatterning. In the illustrative embodiment there are four spacers 182 (FIG. 13G) located proximate to the corners of the semiconductor substrates 54A-54D.

The spacers 182 (FIG. 13A) form spaces 214A-214C (FIG. 13A) between adjacent semiconductor substrates 54A-54D having a spacing S which is equal to the height of the spacers 182. A representative range for the spacing S can be from 10 µm to 100 µm. In addition to forming the spaces 214A-214C (FIG. 13A), the spacers 182 (FIG. 13A) also level and prevent the semiconductor substrates 54A-54D from tilting. The spacers 182 (FIG. 13A) also help to align the semiconductor substrates 54A-54D to one another. As will be further explained the spacers 182 (FIG. 13A) preferably allow some relative movement or shifting laterally between the semiconductor substrates 54A-54D. In addition, the spacers 182 can be configured to providing bearings for moving the semiconductor substrates 54A-54D relative to one another. Further, in the completed component 86SA (FIG. 13E) the spacers 182 provide a material between the semiconductor substrates 54A-54D, which can be configured to provide protection from mechanical, electrical or magnetic influences (e.g., adding an electrical ground plane, or to shield the substrates from stray magnetic fields).

The spaces 214A-214C (FIG. 13A) created by the spacers 182 are maintained throughout the steps of the method, and in the completed semiconductor component 86SA (FIG. 13A) as well. As will be further explained, the spaces 214A-214C (FIG. 13A) facilitate the performance of other steps of the method, such as: a.) bonding, by permitting formation of a column of material (e.g., solder) between adjacent semiconductor substrates 54A-54D, and b.) laser machining, by providing access for a laser beam. Further, in the completed component 86SA (FIG. 13E), the spaces 214A-214C (FIG. 13A) allow fluids for cooling or heating the semiconductor substrates 54A-54D, or for placing a material, such as an underfill layer, or a thermally conductive material, between the semiconductor substrates 54A-54D.

Each semiconductor substrate 54A-54D (FIG. 13A) also includes a through via 76A-76D (FIG. 13A) formed through a substrate contact 58A-58D (FIG. 13A), substantially as previously described for through via 76 (FIG. 3C) and the substrate contact 58 (FIG. 3C) on semiconductor substrate 54 (FIG. 3A). In addition, the substrate contacts 58A-58D (FIG. 13A) can be in electrical communication with integrated circuits 66 (FIG. 3C), and can include insulating layers 78 (FIG. 3C) substantially as previously described.

The first outer semiconductor substrate 54A (FIG. 13A) also includes RDL contacts 70A (FIG. 13A), substantially as previously described for RDL contacts 70 (FIG. 3B). In addition, the first outer semiconductor substrate 54A (FIG. 13A) includes conductors 82A (FIG. 13A), and terminal contacts 84A (FIG. 13A) in electrical communication with the RDL contacts 70A (FIG. 13A), substantially as previously described for conductors 82 (FIG. 3J) and terminal contacts 84 (FIG. 3J). As previously described the conductors 82A can be part of the same redistribution layer that forms the RDL contacts 70.

The inner semiconductor substrates 54B and 54C (FIG. 13A), and the second outer semiconductor substrate 54D as well, include bonding elements 184 (FIG. 13A) on their substrate contacts 58B-58D (FIG. 13A). The bonding elements 184 (FIG. 13A) can comprise circular or polygonal donuts having through openings corresponding in size and shape to the through vias 76B-D. Alternately, the bonding elements 184 (FIG. 13A) can simply comprise dots or mounds of material on the substrate contacts 58B-58D. The bonding elements 184 can be made of a low melting point metal, such as nickel, a nickel alloy, a solder alloy, gold or a gold alloy. Alternately, the bonding elements 184 can be made of a conductive polymer material. In addition, the bonding elements 184 can be formed using a suitable process such as screen printing, deposition through a mask, reflow or polymer curing. As will be further explained, following a heating step, and a shifting step to be described, the bonding elements 184 form bonded connections 186 (FIG. 13E) between the substrate contacts 58B-58D and the wire 14.

As also shown in FIG. 13A, a bottle neck bonding capillary 12BN is provided. In addition, a wire feed mechanism 17BN is operably associated with the bonding capillary 12BN, substantially as previously described for wire feed mechanism 17 (FIG. 1A). The wire feed mechanism 17BN can also be operably associated with clamps 16 (FIG. 1A), which for simplicity is not shown in FIGS. 13A-13F. Although this embodiment of the method is described with the bottle neck bonding capillary 12BN, the bonding capillary 12 (FIG. 1A), or a laser, could also be used.

The bonding capillary 12BN (FIG. 13A) can comprise an element of a wire bonder, such as the previously described bonding capillary 12 (FIG. 1A) configured to perform an ultra fine pitch (e.g., <65 µm) wire bonding process. Suitable bottle neck bonding capillaries are manufactured by SPT (Small Precision Tools) of Petaluma, Calif. One suitable bonding capillary is designated as a molded slim line bottleneck (SBN) capillary. Kulicke & Soffa Industries Inc. of Willow Grove, Pa. also manufactures suitable bonding capillaries.

Initially, as shown in FIG. 13A, the semiconductor substrates 54A-54D are aligned and attached to form the stacked array 180. In the stacked array 180 all of the through vias 76A are aligned along a common longitudinal axis 216 within a tolerance of plus or minus 5-10 µm. Alignment of the semiconductor substrates 54A-54D, and forming of the spacers 182 can be accomplished using equipment and techniques known in the art, such as aligner bonders, mechanical fixtures and reflow ovens. In addition, the bonding capillary 12BN is aligned with the via 76A in the first outer semiconductor substrate 54A.

Next, as shown in FIG. 13B, a threading step is performed by operating the wire feed mechanism 17BN to thread the wire 14 through the aligned vias 76A-76D such that the end 218 of the wire 14 projects from a back side 64D of the second outer semiconductor substrate 54D. Alternately, the threading step can be performed substantially as previously described in FIG. 2A, by forming the tail length TL (FIG. 2A) of the wire 14 and then moving the bonding capillary 12 in the z-direction.

Next, as shown in FIG. 13C, a ball forming step is performed in which the EFO wand 18 is used to form a contact ball 90 on the terminal portion of the wire 14, substantially as previously described and shown in FIG. 2B.

Next, as shown in FIG. 13D, a pulling and wedging step is performed to pull the contact ball 90 against the back side 64D of the second outer semiconductor substrate 54D, and to wedge the contact ball 90 into the via 76D.

As also shown in FIG. 13D, a stitch bonding step is performed in which a bonded contact 92 is formed on the RDL contact 70A on the first outer semiconductor substrate 54A. In addition, a severing step is performed substantially as previously described to sever the wire 14 from the bonded contact 92. The completed through wire interconnect 102SA (FIG. 13A) includes a length of the wire 14 threaded through the aligned vias 76A-76D. The through wire interconnect 102SA also includes the contact ball 90 on the back side 64D of the second outer semiconductor component 54D, and the bonded contact 92 on the RDL contact 70A on the first outer semiconductor substrate 54A.

Next, as shown in FIG. 13E, a bonding step is performed in which the bonding elements 184 are bonded to the wire 14 to form bonded connections 186. However, prior to the bonding step, a shifting step can be performed in which the middle semiconductor substrates 54B, 54C are shifted in opposite directions (or in the same direction) as indicated by arrows 210, 212. The shifting step can be performed using a suitable mechanism such as a pusher rod. The shifting step pinches the wire 14, such that it touches the aligned vias 58A-58D and contacts the bonding elements 184. The shifting step is preferably done such that the alignment of the vias 58A-58D is only shifted by several microns. For example, the inner semiconductor substrate 54B can be shifted to the right by from 5 μm to 15 μm, and the inner semiconductor substrate 54C can be shifted to the left by from 5 μm to 15 μm, for a total shift of from 10 μm to 30 μm. As previously stated, the spacers 182 can be configured to facilitate the shifting step by providing bearing surfaces.

Figure 13F:
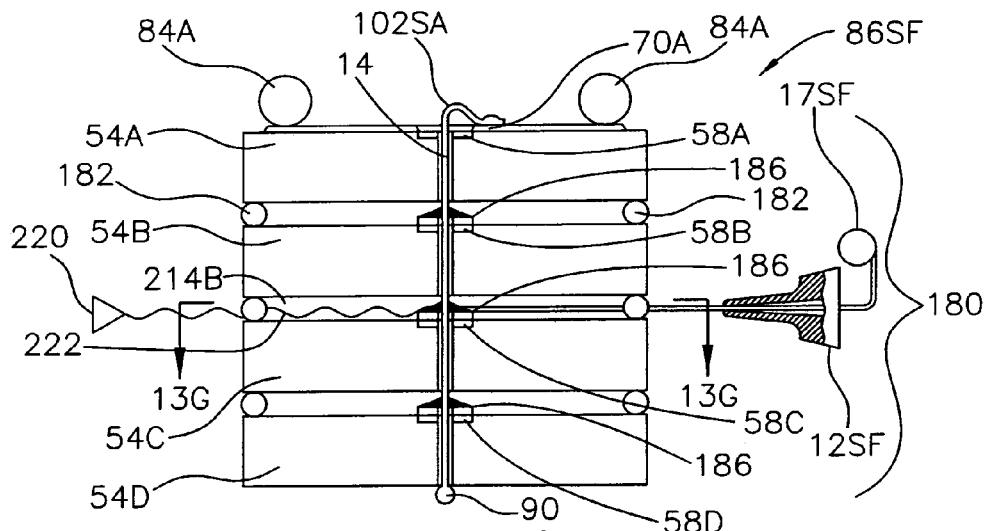

As shown in FIG. 13F, the bonding step can be performed using a laser 220 configured to direct a laser beam 222 through the spaces 214A, 214B, 214C (FIG. 13A) between the semiconductor substrates 54A-54D. In addition, the laser beam 222 is focused upon the bonding elements 184 (FIG. 13D), one bonding element 184 at a time, to provide localized heating for melting and reflowing the bonding elements 184. The reflowed bonding elements 184 form bonded connections 186 between the substrate contacts 58B-58D and the wire 14. In the completed through wire interconnect 102SA (FIG. 13E) the bonded connections 186 electrically and structurally connect the semiconductor substrates 54A-54D to one another. Suitable laser systems for performing the laser machining step are manufactured by XSIL LTD of Dublin, Ireland, and by Electro Scientific, Inc., of Portland, Oreg.

As shown in FIG. 13E, the completed stacked array semiconductor component 86SA includes the stacked array 180, and the through wire interconnect 102SA which electrically connects the semiconductor substrates 54A-54D. If the semiconductor substrate 54A-54D comprise semiconductor dice, the stacked array semiconductor component 86SA can be referred to as a stack of die (SOD).

Figure 14:
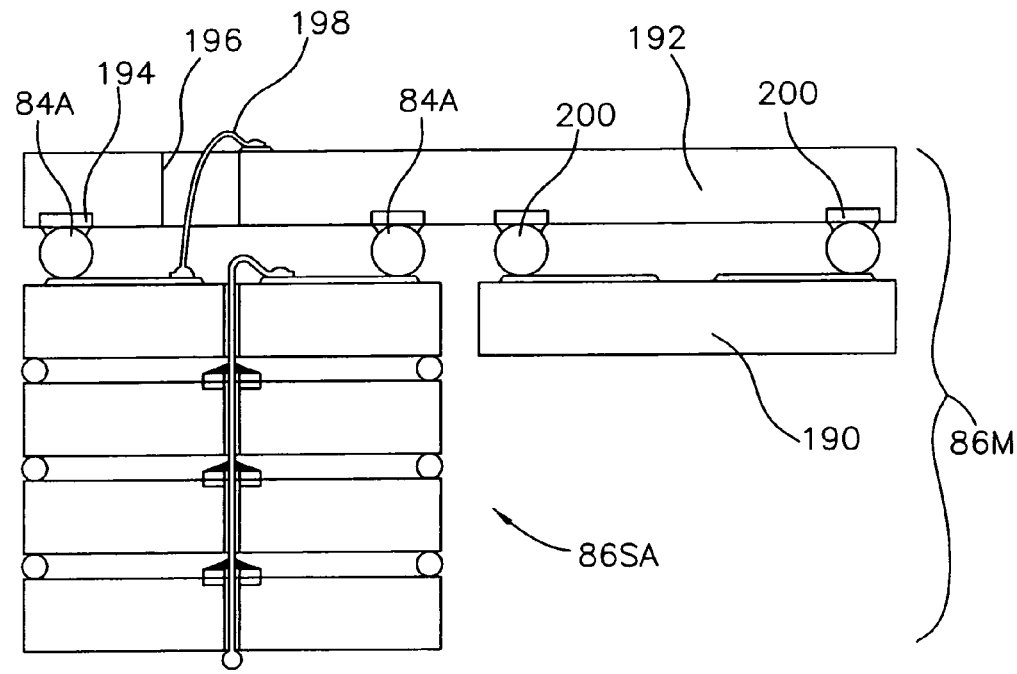
FIG. 14 is a schematic cross sectional view of a stacked array semiconductor component and a module semiconductor component constructed using the stacked method.

As shown in FIG. 14, a stacked module semiconductor component 86M includes the stacked array semiconductor component 86SA, and a CPU component 190 mounted to a supporting substrate 192, to form a module, such as an imager module, or a memory-microprocessor module. In addition, the terminal contacts 84A (FIG. 13E) of the stacked module semiconductor component 86M can be bonded to electrodes 194 on the supporting substrate 192. Further, an optional additional through wire interconnect 198 (FIG. 14) placed through opening 196 can be used to electrically connect other elements on the supporting substrate 192 to selected contact points on the stacked array 180.

Figure 13G:
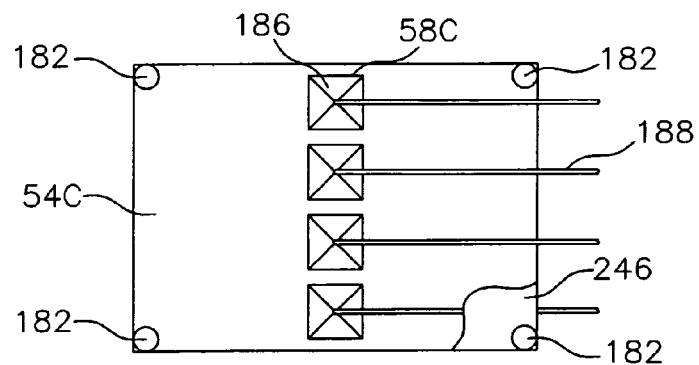
FIG. 13G is a view taken along line 13G-13G of FIG. 13F with a cut away insulating layer.

Referring to FIGS. 13F and 13G, an optional additional side wire feed and bond step can be performed to form a side wire semiconductor component 86SF which includes side wire interconnects 188. In this case, a side feed bonding capillary 12SF, and an associated wire feed mechanism 17SF, can be used to thread side wires 188 in the space 214B between the inner semiconductor substrates 54B and 54C. In addition, the laser 220 can be used to direct the laser beam 222 through the space 214B to form the bonded connections 186 and bond the side wires 188 to the bonded connections 186.

The side wire feed and bond step can be performed by rotating the stacked array 180 (FIG. 13F) ninety degrees and aligning the side feed bonding capillary 12SF to the space 214B. Side feeding can be self guiding by the dimensions of the space 214B, or an alignment structure, such as a pattern resist, can be formed in the space 214B. As another alternative, a real time alignment system such as an x-ray vision system can be used to adjust the path of the wire 14 in the manner of a medical procedure for threading a catheter through an artery. As another alternative, side feeding can be performed using an electrical sensing system configured to sense the point at which the wire 14 touches the bonding elements 184 (FIG. 13D). As another alternative, side feeding can be performed using a guide tube attached to the side feed bonding capillary 12SF configured to guide the wire 14 through the space 214B.

Also during the side wire feed and bond step, the laser 220 (FIG. 13F) can be operated in conjunction with the side feed bonding capillary 12SF (FIG. 13F) to form the bonded connections 186 (FIG. 13G). For example, the laser 220 can fire to melt the bonding element 184 (FIG. 13D) as the side wire 188 is pushed into the molten material. Cooling of the molten material then forms the bonded connections 186 (FIG. 13G). In addition, a support layer 246 formed of a curable polymer, such as a UV curable epoxy or parylene, can be formed in the space 214B to prevent movement and wire sweep of the side wires 188 (FIG. 13G). Conventional underfill materials can be used to form the support layer 246. One suitable material for forming the support layer 246 is the previously described wire sweep encapsulant sold by Kulicke & Soffa under the trademark "NOSWEEP" encapsulant.

Figure 15A:
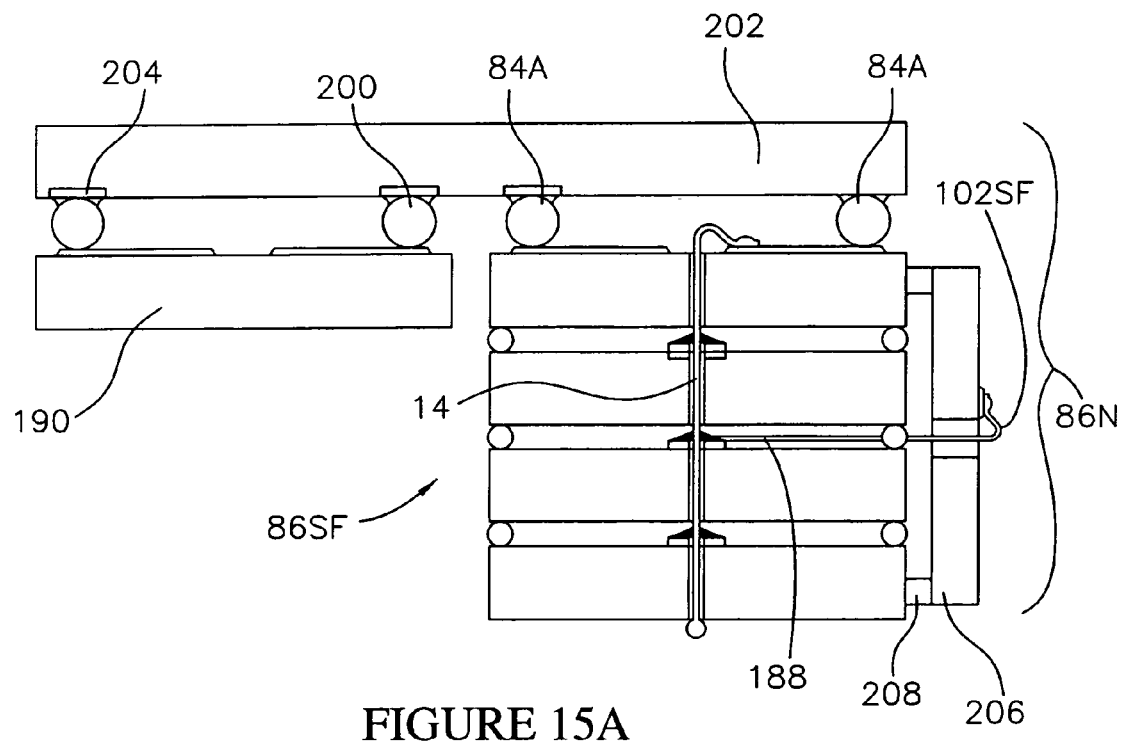
FIG. 15A-15D are schematic cross sectional views of stacked array side element semiconductor components and module semiconductor components constructed using the stacked method.
Figure 15B:
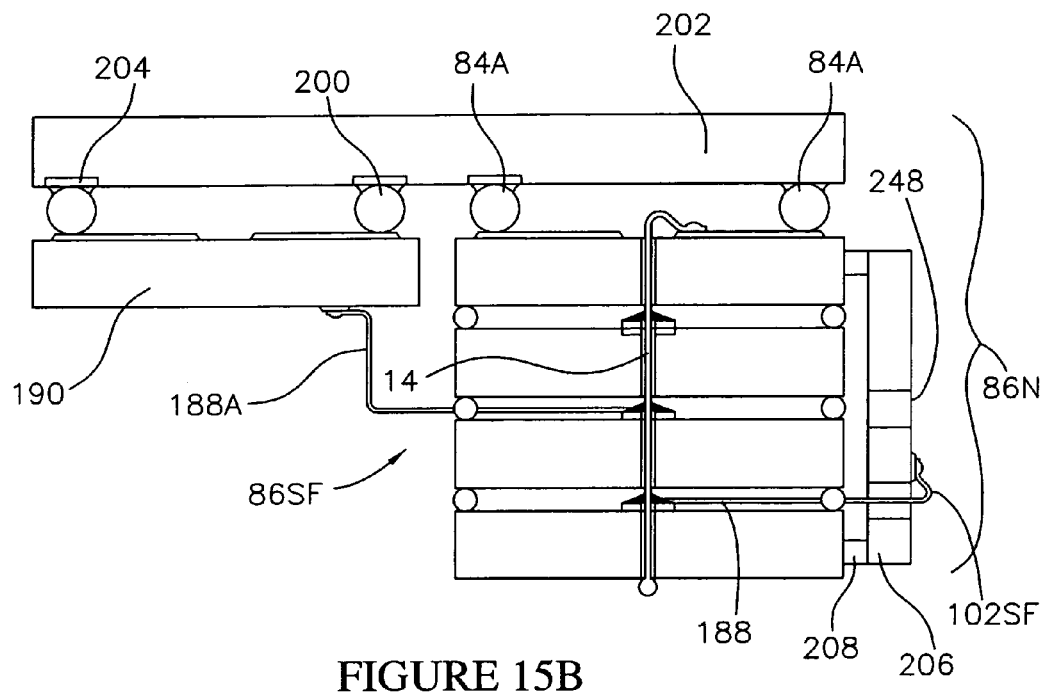
Figure 15C:
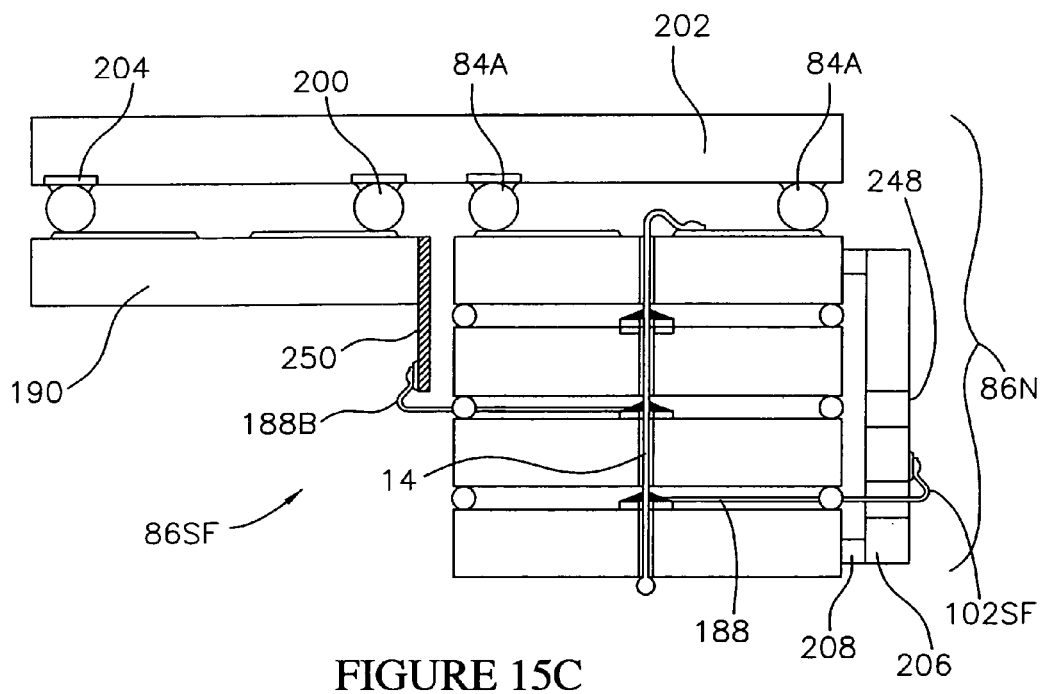
Figure 15D:
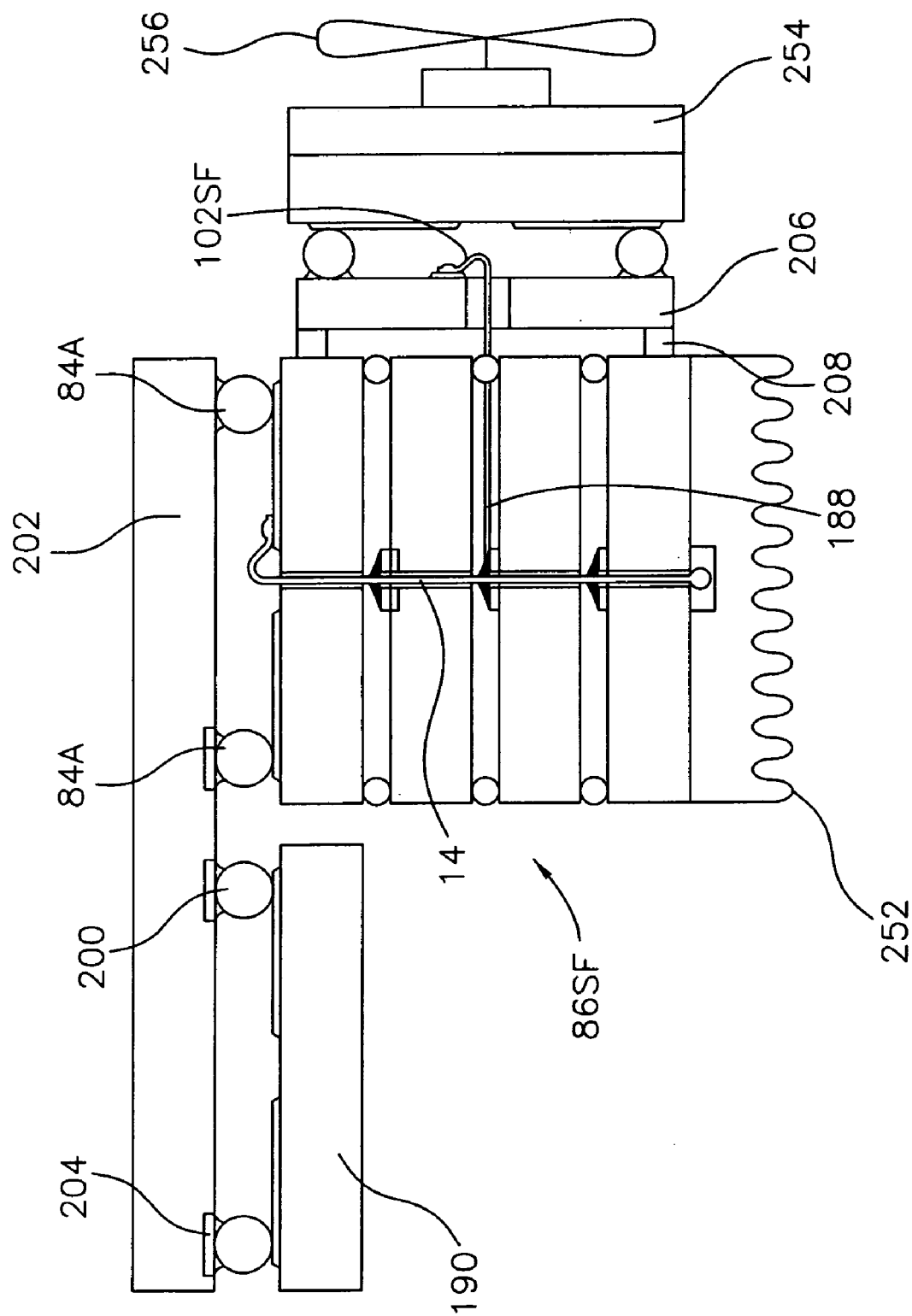

As shown in FIG. 15A, the side wire semiconductor component 86SF can include a side mounted element 206 such as a capacitor, another semiconductor substrate, a semiconductor package or a cooling assembly. In addition, the completed side feed through wire interconnect 102SF includes the side wire 188 bonded to the side mounted element 206. As also shown in FIG. 15A, a semiconductor component 86N includes the side wire semiconductor component 86SF and the CPU component 190 mounted to a supporting substrate 202, substantially as previously described for module component 86M (FIG. 14). As shown in FIG. 15B, the semiconductor component 86N can include a first side wire 188 and a second side wire 188A bonded to the CPU component 190 and to the wire 14. In this case, an opening 248 in the side mounted element 206 provides access for the laser beam 222 (FIG. 13F) for bonding the second side wire 188A. In addition, the bonding capillary 12SF (FIG. 13F) can be configured for rotation by 90° from the position shown in FIG. 13F. As shown in FIG. 15C, the CPU component 190 can also include a riser substrate 250, and a second side wire 188B bonded to the riser substrate 250. The riser substrate 250 can comprise a printed circuit board, a ceramic substrate, a plastic substrate, a metal substrate, or other element, having conductors and wire bond pads in a required configuration. As shown in FIG. 15D, the side wire semiconductor component 86SF can also include a heat sink 252. As also shown in FIG. 15D, the side mounted element 206 can include a cooling assembly 254 having a cooling fan 256. As another alternative, the side mounted element 206 can comprise a substrate housing a CPU to memory buffer-bridging device (like a NORTH-BRIDGE chipset or an INTEL HUB ARCHITECTURE (IHA) chip set). In addition, the side mounted element 206 could include a socket for mounting a side mountable CPU package attached to the cooling assembly 254.

Figure 16:
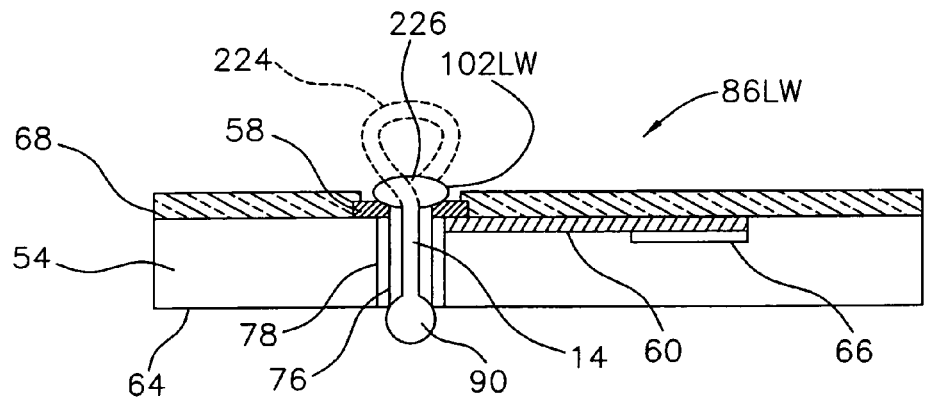
FIG. 16 is a schematic cross sectional view of an alternate embodiment looped wire semiconductor component.

Referring to FIG. 16, an alternate embodiment looped wire semiconductor component 86LW is illustrated. The looped wire semiconductor component 86LW includes the semiconductor substrate 54, the via 76, the insulating layer 78, the substrate contact 58, the internal conductor 90, the integrated circuits 66, and the passivation layer 68, all of which are constructed substantially as previously described.

The looped wire semiconductor component 86LW (FIG. 16) also includes a through wire interconnect 102LW (FIG. 16) formed by looping the wire 14 into a looped wire 224 (FIG. 16), which is then compressed to form a compressed bump 226 (FIG. 16). The looped wire 224 can be formed, and compressed into the bump 226, using the bonding capillary 12 (FIG. 2A). In addition, the looped wire semiconductor component 86LW (FIG. 16) can be used to fabricate a stacked component similar to the stacked component 146 (FIG. 8). In this case the through wire interconnect 102LW can be used to make bonded connections between adjacent looped wire semiconductor components 86LW.

Figure 17:
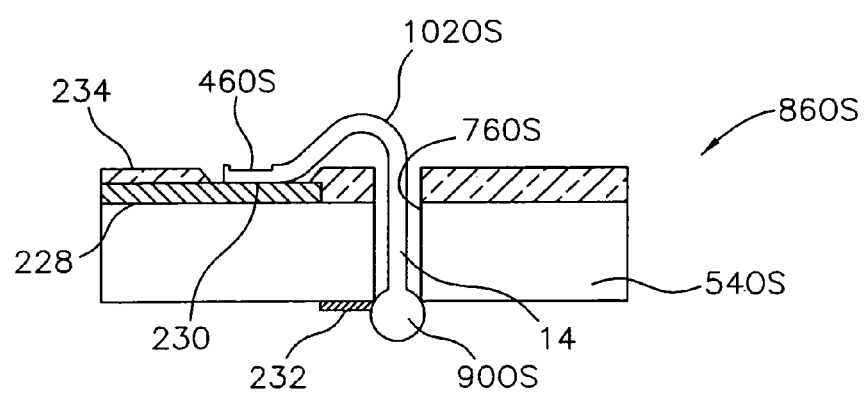
FIG. 17 is a schematic cross sectional view of an alternate embodiment organic substrate semiconductor component.

Referring to FIG. 17, an alternate embodiment organic substrate semiconductor component 86OS is illustrated. The semiconductor component 86OS includes an organic substrate 54OS made of an organic material, such as a circuit board material, a glass filled polymer or a plastic. In this embodiment, the semiconductor component 86OS can be in the form of a printed circuit board, a flex circuit, a TAB tape, a leadframe, a BOC semiconductor package, a COB semiconductor package, or a chip scale semiconductor package.

The semiconductor component 86OS (FIG. 17) also includes a conductive trace 228 (FIG. 17) having a wire bondable contact 230 (FIG. 17), and a polymer insulating layer 234 (FIG. 17). The semiconductor component 86OS (FIG. 17) also includes a through wire interconnect 102OS (FIG. 17) formed in a through via 76OS (FIG. 17) in the organic substrate 54OS (FIG. 17) substantially as previously described for through wire interconnect 102 (FIG. 3E). The through wire interconnect 102OS (FIG. 17) includes a contact ball 90OS (FIG. 17) in contact with the organic substrate 54OS (FIG. 17), and optionally with a back side contact 232 (FIG. 17) on the organic substrate 54OS (FIG. 17). The through wire interconnect 102OS also includes a stitch bond 46OS (FIG. 17) bonded to the conductive trace 228 (FIG. 17).

Figure 18:
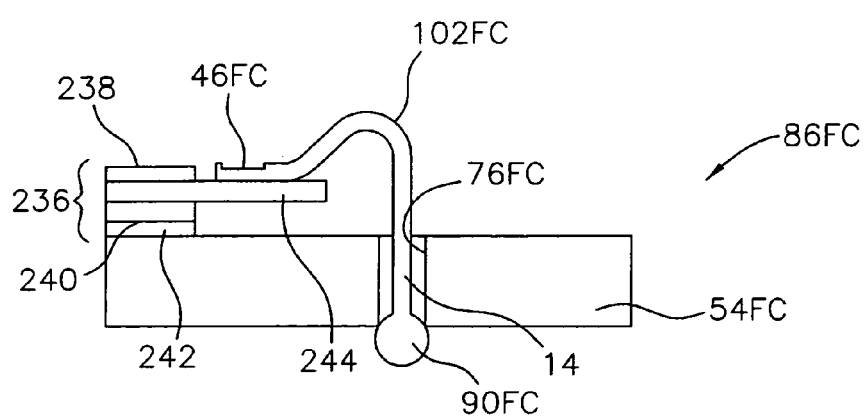
FIG. 18 is a schematic cross sectional view of an alternate embodiment flex circuit semiconductor component.

Referring to FIG. 18, an alternate embodiment flex circuit semiconductor component 86FC is illustrated. The semiconductor component 86FC includes a substrate 54FC having a flex circuit 236 attached thereto. The substrate 54FC can comprise a ceramic, a plastic, a metal, or a semiconductor material. The flex circuit 236 includes dielectric layers 238, 240 formed of a flexible polymer material (e.g., polyimide tape), and a conductive trace 244 sandwiched between the dielectric layers 238, 240. In addition, an adhesive layer 242 attaches the flex circuit 236 to the substrate 54FC.

The semiconductor component 86FC (FIG. 18) also includes a through wire interconnect 102FS (FIG. 18) formed in a through via 76FS (FIG. 18) in the substrate 54FS (FIG. 18) substantially as previously described for through wire interconnect 102 (FIG. 3E). The through wire interconnect 102FS (FIG. 18) includes a contact ball 90FS (FIG. 18) in contact with the substrate 54FS (FIG. 18), and a stitch bond 46FS (FIG. 18) bonded to the conductive trace 244 (FIG. 18). The semiconductor component 86FC could be used as a test interconnect configured as a probe card, or a known good die carrier. In this case, the wire 14 could be encapsulated in the via 76FS, but with the contact ball 90FS free to move upon contact with a test pad of a device under test, substantially as previously described for the contact ball 90 of FIGS. 11A and 11B.

Thus the invention provides a method and a system for fabricating semiconductor components, and improved semiconductor components as well. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
   providing a substrate having a first side, a second side, a substrate contact on the first side, and a via extending through the substrate contact and the substrate from the first side to the second side;
   providing a bonding capillary having a wire with a terminal portion;
   threading the terminal portion through the via to the second side by operating the bonding capillary from the first side;
   forming a contact on the terminal portion from the second side; and
   forming a loop portion of the wire extending from the via to the substrate contact, and a bonded contact between the wire and the substrate contact, using the bonding capillary.

2. The method of claim 1 wherein the threading step comprises forming the terminal portion with a selected length projecting from the bonding capillary, aligning the terminal portion with the via, then moving the bonding capillary by approximately the selected length to place the terminal portion through the via.

3. The method of claim 1 wherein the threading step comprises aligning the terminal portion with the via then feeding a selected length of the wire through the via.

4. The method of claim 1 wherein the contact comprises a free air ball formed by electronic flame off.

5. The method of claim 1 wherein the substrate comprises a semiconductor substrate having at least one integrated circuit in electrical communication with the substrate contact.

6. The method of claim 1 wherein the contact is configured to electrically engage a semiconductor substrate having at least one integrated circuit.

7. The method of claim 1 further comprising stacking a second substrate on the substrate having a second contact bonded to the contact.

8. The method of claim 1 further comprising stacking a second substrate on the substrate having a second contact bonded to the loop portion.

9. The method of claim 1 wherein the substrate comprises a semiconductor material having an integrated circuit and the substrate contact comprises a redistribution contact in electrical communication with the integrated circuit.

10. The method of claim 1 further comprising forming a terminal contact on the first side in electrical communication with the substrate contact.

11. A method for fabricating a semiconductor component comprising:
    providing a substrate having a first side, a second side, and a substrate contact on the first side;

forming a via through the substrate contact and the substrate from the first side to the second side;

providing a bonding capillary having a wire with a terminal portion having a selected length;

placing the terminal portion of the wire into the via to the second side by moving the bonding capillary towards the first side by approximately the selected length;

forming a contact on the wire from the second side using electronic flame off;

looping the wire over the substrate contact;

forming a bonded contact between the wire and the substrate contact; and severing the wire from the bonded contact.

12. The method of claim 11 wherein following the severing step a through wire interconnect comprises the contact, a portion of the wire in the via, a loop portion of the wire over the substrate contact, and the bonded contact.

13. The method of claim 11 wherein the substrate comprises a semiconductor substrate having an integrated circuit in electrical communication with the substrate contact.

14. The method of claim 11 further comprising following the contact step, moving the bonding capillary away from the first side to wedge the contact in the via.

15. The method of claim 11 wherein the forming the contact step is performed using a second bonding capillary.

16. The method of claim 11 further comprising forming a stud bump on the bonded contact and the substrate contact.

17. A method for fabricating a semiconductor component comprising:

providing a semiconductor substrate having a circuit side, a back side, an integrated circuit, and a substrate contact in electrical communication with the integrated circuit;

forming a via having an inside diameter through the substrate contact and the semiconductor substrate to the back side;

providing a bonding capillary having a wire with an outside diameter and a terminal portion;

threading the terminal portion of the wire into the via by moving the bonding capillary with the terminal portion towards the circuit side by a selected length, or by spooling the terminal portion from the bonding capillary by the selected length;

forming a contact ball on the wire en from the backside having a diameter greater than the inside diameter of the via;

looping the wire from the via to the substrate contact using the bonding capillary;

forming a bonded contact on the circuit side between the wire and the substrate contact; and severing the wire from the bonded contact.

18. The method of claim 17 wherein following the severing step a through wire interconnect includes the contact ball, a portion of the wire in the via, a loop portion of the wire over the substrate contact, and the bonded contact.

19. The method of claim 17 wherein the further comprising forming a stud bump on the bonded contact using a separate stud bumper.

20. The method of claim 17 further comprising forming a conductor on the circuit side in electrical communication with the bonded contact, and a terminal contact on the circuit side in electrical communication with the conductor.

21. The method of claim 17 further comprising forming an encapsulant at least partially encapsulating the wire in the via.

22. The method of claim 17 wherein the substrate contact comprises a device bond pad or a redistribution contact.

23. The method of claim 17 wherein the bonded contact comprises a stitch bond formed using the bonding capillary, and further comprising forming a stud bump on the stitch bond using the bonding capillary.

24. The method of claim 17 further comprising following the forming the contact ball step, wedging the contact ball into the via by moving the bonding capillary away from the circuit side.

25. The method of claim 17 wherein the providing the semiconductor substrate step comprises providing a semiconductor wafer containing a plurality of semiconductor substrates.

26. The method of claim 17 further comprising attaching a second semiconductor substrate to the semiconductor substrate by forming a bonded connection between a second contact on the second semiconductor substrate and the contact ball.

27. A method for fabricating a semiconductor component comprising:

providing a semiconductor substrate having a first side, an integrated circuit, a substrate contact on the first side in electrical communication with the integrated circuit, a second side, and a via through the substrate contact and the substrate extending from the first side to the second side;

forming a through wire interconnect on the semiconductor substrate comprising a wire having a terminal portion in the via, a contact on the wire wedged in the via proximate to the second side, a loop portion of the wire over the substrate contact, and a bonded contact on the substrate contact;

the forming step comprising:

operating a bonding capillary from the first side to place the terminal portion of the wire into the via;

forming a contact on the terminal portion from the second side; and forming the loop portion of the wire and the bonded contact using the bonding capillary.

28. The method of claim 27 wherein the operating step comprises moving the bonding capillary towards the first side by a distance approximately equal to a length of the terminal portion.

29. The method of claim 27 wherein the operating step comprises spooling the wire from the bonding capillary by a length of the terminal portion.

30. The method of claim 27 further comprising bonding a second substrate to the semiconductor substrate by forming a bonded connection between the through wire interconnect and a second contact on the second substrate.

31. The method of claim 30 wherein the bonded connection comprises an element selected from the group consisting of solder joints, mechanical connections, welded connections, and conductive polymer connections.

32. The method of claim 30 wherein the bonded contact includes a stud bump configured to formed the bonded connection.

* * * * *

UNITED STATES PATENT AND TRADEMARK OFFICE
CERTIFICATE OF CORRECTION

PATENT NO. : 7,371,676 B2  Page 1 of 1
APPLICATION NO. : 11/102408
DATED : May 13, 2008
INVENTOR(S) : Hembree It is certified that error appears in the above-identified patent and that said Letters Patent is hereby corrected as shown below:

In column 23, line 44, in Claim 17, after "wire" delete "en".

Signed and Sealed this

Twenty-sixth Day of August, 2008

JON W. DUDAS
*Director of the United States Patent and Trademark Office*